(12) United States Patent
Savas et al.

(10) Patent No.: US 9,852,887 B2
(45) Date of Patent: Dec. 26, 2017

(54) ION SOURCE OF AN ION IMPLANTER

(71) Applicant: ADVANCED ION BEAM TECHNOLOGY, INC., Fremont, CA (US)

(72) Inventors: Stephen Edward Savas, Pleasanton, CA (US); Xiao Bai, Fremont, CA (US); Zhimin Wan, Sunnyvale, CA (US); Peter M. Kopalidis, Fremont, CA (US)

(73) Assignee: Advanced Ion Beam Technology, Inc., Hsin-Chi (TW)

( * ) Notice: Subject to any disclaimer, the term of this patent is extended or adjusted under 35 U.S.C. 154(b) by 1079 days.

(21) Appl. No.: 13/975,206

(22) Filed: Aug. 23, 2013

(65) Prior Publication Data

US 2015/0056380 A1    Feb. 26, 2015

(51) Int. Cl.
*H01J 37/317*    (2006.01)
*H01J 37/08*    (2006.01)

(52) U.S. Cl.
CPC .......... *H01J 37/3171* (2013.01); *H01J 37/08* (2013.01); *H01J 2237/0815* (2013.01); *H01J 2237/0817* (2013.01)

(58) Field of Classification Search
None
See application file for complete search history.

(56) References Cited

U.S. PATENT DOCUMENTS

| | | | |
|---|---|---|---|
| 3,277,416 A * | 10/1966 | Barr | H05K 9/0064 336/189 |
| 4,847,504 A * | 7/1989 | Aitken | H01J 27/022 250/423 R |
| 6,253,704 B1 * | 7/2001 | Savas | H01J 37/32082 |
| 6,356,025 B1 | 3/2002 | Freeman et al. | |
| 7,455,030 B2 | 11/2008 | Sakai | |
| 8,800,483 B2 * | 8/2014 | Vandermeulen | C23C 16/511 118/723 MA |
| 2001/0023743 A1 * | 9/2001 | Savas | H01J 37/32082 156/345.48 |
| 2002/0033233 A1 * | 3/2002 | Savas | H01J 37/321 156/345.48 |
| 2002/0125829 A1 * | 9/2002 | Vella | H01J 37/08 315/111.81 |
| 2003/0205680 A1 * | 11/2003 | Benveniste | H01J 37/08 250/423 R |

(Continued)

*Primary Examiner* — Douglas W Owens
*Assistant Examiner* — Srinivas Sathiraju
(74) *Attorney, Agent, or Firm* — Donald E. Stout; Stout, Uxa & Buyan, LLP

(57) ABSTRACT

An ion source uses at least one induction coil to generate ac magnetic field to couple rf/VHF power into a plasma within a vessel, where the excitation coil may be a single set of turns each turn having lobes or multiple separate sets of windings. The excitation coil is positioned outside and proximate that side of the vessel that is opposite to the extraction slit, and elongated parallel to the length dimension of the extraction slit. The conducting shield(s) positioned outside or integrated with the well of the vessel are used to block the capacitive coupling to the plasma and/or to collect any rf/VHF current may be coupled into the plasma. The conducting shield positioned between the vessel and the coil set can either shield the plasma from capacitive coupling from the excitation coils, or be tuned to have a higher rf/VHF voltage to ignite or clean the source.

68 Claims, 14 Drawing Sheets

(56) References Cited

U.S. PATENT DOCUMENTS

| | | | |
|---|---|---|---|
| 2004/0104682 A1* | 6/2004 | Horsky | H01J 27/205 315/111.81 |
| 2004/0119025 A1* | 6/2004 | Klepper | G21K 1/08 250/424 |
| 2007/0176115 A1* | 8/2007 | Horsky | H01J 27/205 250/427 |
| 2009/0032727 A1 | 2/2009 | DiVergilio et al. | |
| 2009/0227095 A1* | 9/2009 | Bateman | H01L 31/1804 438/514 |
| 2010/0129272 A1 | 5/2010 | Fujita et al. | |
| 2010/0151694 A1* | 6/2010 | Peuse | H01L 21/0223 438/770 |
| 2011/0240876 A1 | 10/2011 | Sinclair et al. | |
| 2011/0259269 A1 | 10/2011 | Biloiu et al. | |
| 2012/0034136 A1 | 2/2012 | Collins et al. | |
| 2012/0049738 A1 | 3/2012 | Fujita et al. | |
| 2012/0293070 A1* | 11/2012 | Kurunczi | H01J 37/08 315/111.21 |
| 2012/0298039 A1* | 11/2012 | Peuse | H01L 21/0223 |
| 2013/0082599 A1* | 4/2013 | Hadidi | H01J 37/08 315/111.41 |
| 2014/0097752 A1* | 4/2014 | Biloui | H01J 37/32119 315/111.81 |
| 2015/0056380 A1* | 2/2015 | Savas | H01J 37/3171 427/523 |

\* cited by examiner

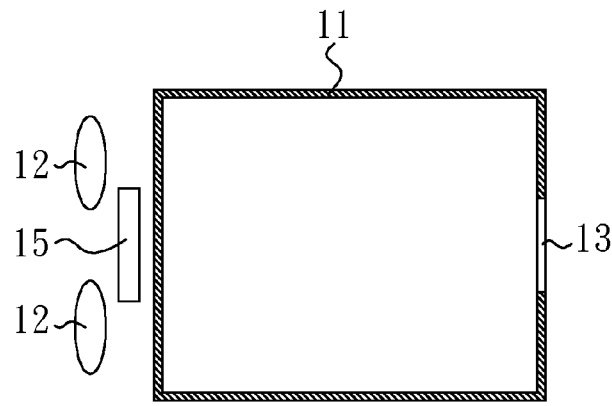

FIG.2C

Prepare an ion source which has a vessel, a coil set, a conducting shield, a RF/VHF generator and a reactive circuit. The coil set is positioned outside the vessel and proximate to the wall of the vessel, the conducting shield is positioned outside the vessel and between the coil set and the wall of the vessel, the RF/VHF generator is electrically connected to the coil set, and the reactive circuit is electrically connected to the conducting shield. ~301

Adjust the operation of both the RF/VHF generator and the reactive circuit to perform at least one of the following: cleaning the vessel, igniting a plasma inside the vessel, and maintain a plasma inside the. ~302

FIG.3

ION SOURCE OF AN ION IMPLANTER

BACKGROUND OF THE INVENTION

1. Field of the Invention

The present disclosure relates generally to an ion source of an ion implanter, and more particularly to an ion source using the inductive magnetic field generated by at least one coil to transmit power into a nearby vessel and using both a first conducting shield around the plasma and a second conducting shield to reduce the oscillation of the plasma inside the vessel and to thereby reduce the energy range of ions extracted from the plasma.

2. Description of Related Art

Ion implantation is a needed but expensive process for modern device fabrication, such as semiconductor device fabrication or flat panel fabrication. It is used mainly to do "doping"—introducing small concentrations of chemically active species into the workpiece, such as semiconducting materials, usually silicon. There is no alternative process to this in most cases. Implantation is also used increasingly for other applications such as definition of critical areas on the device and control of the mobility of dopants in the workpiece. Implantation is expensive because the large and complex implant systems used to perform the process have a high cost and their productivity is not as high as many other fabrication processes. In many cases, this low productivity is due to the limitations of the sources which are used for producing the ions.

The legacy sources now predominantly used in implanters performing this application are the "Bernas" type source—which has a hot cathode to emit electrons at one end of the source. These electrons are confined by a strong magnetic field and reflected at the other end of the source. These electrons form a virtual cathode by traveling along the magnetic field parallel to the extraction slit. Ionization occurs along their path and the ions then fall into the extraction slit for acceleration and ultimately implantation. However, these sources require frequent and expensive maintenance (every 500 hours or so) due to their use of filaments and hot cathodes to produce the electrons. Such hot cathodes in combination with chemistry in the source cause migration of metals, such as tungsten, that ultimately must be removed from the vacuum system and manually cleaned, taking the implanter out of service while the source is rebuilt.

Further, this ion source produces only modest ion currents of the desired species (Boron, arsenic, phosphorus, carbon, silicon, germanium, antimony and others) and, because of residues left in the source after producing one ionic species cannot switch easily from implanting that ionic species to a different one.

A source having such design that it allows the source to be cleaned without manually removing it or breaking vacuum would dramatically reduce the cost, and improve productivity of the very expensive implanter. Further, it would be helpful to the productivity of the implanter if more of the desired species could be produced by the source. This would allow the doping current on the wafer, substrate or workpiece to be increased. Further, if such higher current could be produced at a given level of current extraction from the source—it would both save power of the high voltage accelerating power supply and reduce sputtering of beam stops and baffles where high energy currents of undesired ion species are dumped, reducing particle generation in the vacuum system. Also, the productivity benefits of larger wafers and more uniform and rapid sweeping of the ion beam across the wafer would make it beneficial to have an ion beam extracted from a longer extraction slot. However, this can only be done efficiently if the ion density and extracted current density have only minimal variation along the slot. If the density of plasma along the length is not uniform, the extracted ion beam has focusing that varies along the long transverse dimension of the extracted "ribbon" beam resulting in less efficient utilization of the extracted ions.

Other types of ion sources have been tried and each has been found to have serious problems that ultimately prevented its adoption for mass production. Many designs of the Radio Frequency (rf)/Very High Frequency (VHF) sources have been developed and tested during the past years. In general, a rf/VHF generator is positioned outside a chamber and electrically connected to the coil or antenna. The electromagnetic field from the coil or antenna then transmits the rf/VHF power into the chamber so that the gas inside the chamber is ionized to form a plasma from which an ion beam is extracted through an extraction slit on the front wall of the chamber. Typically, these rf/VHF sources have a higher spread in the energy of the extracted ions due to the rf or VHF oscillation of the plasma potential. Ions extracted at the maximum and minimum of the plasma potential have different energies that may differ by up to ten or more eV resulting in less effective focusing of the ions in the beam, especially at low ion energies and higher currents, as is required for some shallow and ultra-shallow doping processes. When electrostatic shielding is used to reduce the rf plasma potential amplitude in an rf or VHF ion source, there is difficulty in igniting the plasma. Further, such rf sources, whether shielded or not, are hard to clean with in-situ, plasma cleaning unless a biasing electrode is disposed within the plasma vessel. Such electrode within the source may effectively ignite the plasma, but the disadvantages include wear and contamination. Further, these sources usually have difficulty in making the ion density uniform along the length of the extraction slit. This uniformity is needed for efficient ion utilization and cleanliness. Uniformity needs to be maintained for a range of feed gases and source gas pressures without making source volume inordinately large that may make it difficult to fit within the high voltage segment of the beamline within the implanter and inefficient. For examples, some known concepts and variations of the RF/VHF ion source may be provided by the following documents: US 20120049738, US 20120034136, U.S. Pat. No. 6,356,025, U.S. Pat. No. 7,455,030, US 20090032727, US 20100129272, US 20110240876, and US 20110259269.

Accordingly, it is desired to develop a new rf/VHF ion source for providing ion beam with smaller ion energy spread and higher beam uniformity along the ion extraction slit that can generate required ion beams with less hardware cost and higher operation flexibility.

SUMMARY OF THE INVENTION

The invention provides a rf/VHF ion source for use in an ion implanter, where one or more coils are used to generate an inductive plasma within a containment vessel. One or more conducting shields may be placed around or be part of the wall of the vessel, or connected to the coil(s), so as to vary in a controllable manner the capacitive coupling from the coils to the inductive plasma within the vessel.

One preferred embodiment of this invention is an ion source of an ion implanter having a plurality of sets of windings or turns that are separated from each other in a direction parallel to the ion extraction slit of the ion source as shown in FIGS. 1 and 2. Each set of windings may be a single turn as shown in the above cited figures, or in some embodiments may be two or more turns wound in a roughly helical manner so that projection of the turns onto the back of the ion source are substantially overlapping. The ion source also includes a vessel wherein gases are ionized, so that a plasma therein includes numerous ions of desired implantable species. A first side of the vessel has a narrow elongated opening, an extraction slit, through which ions are extracted from the plasma, and then may be accelerated and transported through one or more electrodes as an ion beam. Outside a second side of the vessel adjacent to or opposite from that having the extraction slit, both sets of windings of the coil are positioned at a distance from the vessel and a first conducting lead to the coil is electrically connected to an rf/VHF generator, i.e., a power generator. The rf/VHF power is fed to the coil and is then transmitted as an induced oscillating magnetic field within the vessel, carrying electromagnetic energy to the plasma inside the vessel. In some embodiments the two parts of the coil may be wound in such manner that at any instant of time they produce opposite polarity magnetic fields at the adjacent wall of the vessel.

In some embodiments, a cover shield of electrically conducting material may be positioned outside and close to the vessel. This cover shield may cover part, or even most of, the vessel but does not cover the extraction slit, and leaves uncovered as well an area of the plasma vessel of roughly the same size as the coil that corresponds approximately to the location of the coil. The cover shield is connected to the common electrical potential of the source housing and support flange, as well as of the housing for the supply for rf/VHF power. Thus, this cover shield serves as an rF/VHF anode so that whatever capacitive coupled rf/VHF current from the coil that may conduct to the plasma may be collected by this shield. In some alternative embodiments, part of the wall of the vessel may be a conducting material that may be connected to the common potential, i.e. partial wall of the vessel behaves as the cover shield, or viewed as partial cover shield directly contacts with the wall of the vessel. In some alternative embodiments, a second shield, the coil shield, may be positioned between the coil set and a side of the vessel other than that having the extraction slot. In some embodiments, this conducting coil shield may be electrically connected to the coil at a point such that the parts of the coil on either side of this connection point have approximately equal electrical inductance. In some alternative embodiments, the coil shield may instead be connected to an external rf/VHF voltage source that is variable and controllable so that a sufficient large rf/VHF electrical potential can be imposed on the coil shield to ignite the plasma in the source, but once the plasma is ignited within the source the shield potential can be reduced very substantially to near zero, so that there is a minimum rf/VHF amplitude on the plasma potential in the source.

In some alternative embodiments there may be a compound cover shield that covers most of the surface of the source and which may have two or more segments that are electrically isolated from each other. In some embodiments, of said compound shield there may be no "coil shield". Segments of said cover shield may have different shapes and be connected electrically to different components of the source or ion implanter. One part of said shield, that comprises the larger part of its total area, may be connected to the source housing and support flange that has a common electrical potential with the housing for the supply for rf/VHF power. A second part of said shield may be connected to a point on the coil or antenna that provides power to the plasma, or to a source of alternating current whose frequency matches that provided the coil, and whose phase and magnitude are tunable. In case the second part of the shield is connected to coil, means is provided to vary the impedance from the second end of the coil to the reference potential so that the ratio of the voltages on the two ends of the coil may be varied over a range including negative one.

In some embodiments of said compound shield the first, larger part of the shield may be positioned close to the insulating wall of the source and may be continuous or have slots or openings, but mostly over areas of the source to which the coil is not adjacent. A second part of the shield may have a smaller area than the first and may be positioned so that a larger fraction of its area is situated between the coil and the source. Said second part may have slots or openings so that the induction field from the coil or antenna may penetrate said part of the shield to induce currents within and provide power to the plasma.

The plasma excitation coil which is electrically connected on a first end to the rf/VHF power supply, may be connected on its second end to the common potential of the source support and housing for the rf/VHF power supply. When the source is being used for ion implantation at substantial energies, the common dc electrical potential may be very different from earth ground potential, and may be as much as twenty thousand Volts or even more. In some exemplary embodiments, the second end of the coil may be connected to the common potential through a capacitor. In some preferred embodiments, the capacitor may be a variable capacitor. In some embodiments, the capacitor may be set to a capacitance such that its electrical reactance substantially compensates or nullifies the inductive reactance of that part of the excitation coil comprising from the capacitor to the point of connection to the coil shield so that the total reactance between the coil shield and the common potential is nearly zero. This causes the rf/VHF potential on the coil shield to become close to zero and its dc potential to the common potential of the source housing and rf/VHF power supply housing. The voltage of this conducting shield(s) is controlled then by adjusting the setting of a capacitor that is connected to the second end of the coil.

In some embodiments, in-situ cleaning of the interior walls of the vessel with a gas, such as halogen-containing gas, can be boosted by ion bombardment of walls of the ion source vessel. This may be accomplished by adjusting the capacitor setting such that the rf/VHF voltage of the conducting shield(s) is raised to at least 50 Volts or more, or to ignite the plasma which can then provide the ion beam. Of course, to block the capacitive coupling between the plasma and the coil set, the voltage of the conducting coil shield may be adjusted to zero after the plasma has been ignited. In this way, the energy of the plasma is maintained by the rf or VHF magnetic field produced by the coil set. Also, in some embodiments, the geometric configuration of the conducting cover shield and the conducting coil shield can block the line of sight from the coil set to the plasma inside the vessel, to effectively minimize the capacitive coupling between the plasma and the coil set. Further, in some embodiments, the conducting coil shield may be electrically connected to a reactive circuit element, such as a tunable capacitor, so as to flexibly adjust the rf/VHF voltage of the shield in a range. For example, in a range between about one Volt and about 1000 Volts.

Other preferred embodiments may have different variations. Some preferred embodiments may have only the coil set but none or only one of the cover shield and the coil shield, especially when the ion energy spread induced by the capacitive coupling between the plasma and the coil set (or any neighboring part) is small. Some preferred excitation coil embodiments may have one or more sets of windings or turns. The shape of each turn may have two or more lobes or simple shapes such as round, oval, or other convex shapes. In some embodiments there may be a single coil having a bi-lobed shape and consisting of two or more turns that largely overlap each other but are spaced apart slightly in a direction perpendicular to the plane of the turns (as in FIG. 8A). In some embodiments there are a plurality of coils each of which has at least one turn (e.g., one or more turns) and which coils are displaced from each other in the plane of a winding so they do not overlap (as in FIGS. 6A-6F). The material of the vessel is not limited, although dielectric material, such as quartz or alumina ceramic, is popularly used. The distance between the coil set and the vessel is not limited, although the distance for some popular ion sources usually is on the order of centimeters. The coil shield and the coil set can be powered by the same source or by separate sources, the only two requirements are that the rf/VHF power can be properly transmitted to the coil set and the voltage of the conducting shield can be flexibly adjusted. There are many other available variations of these preferred embodiments, when the energy of the plasma can be provided by the coil set and the ion energy spread can be minimized by the existence of the shield(s).

BRIEF DESCRIPTION OF THE DRAWINGS

FIG. 2A, FIG. 2B and FIG. 2C briefly illustrate three apparatus embodiments;

FIG. 3 is a brief flowchart of a method embodiment of this invention;

DETAILED DESCRIPTION OF THE INVENTION

The detailed description of the present invention will be discussed in the following embodiments, which are not intended to limit the scope of the present invention, but can be adapted for other applications. While drawings are illustrated with some details, it is appreciated that the details of the design of the disclosed components may differ from that disclosed, except where the description expressly restricts the characteristics of the components.

Figure 1A:
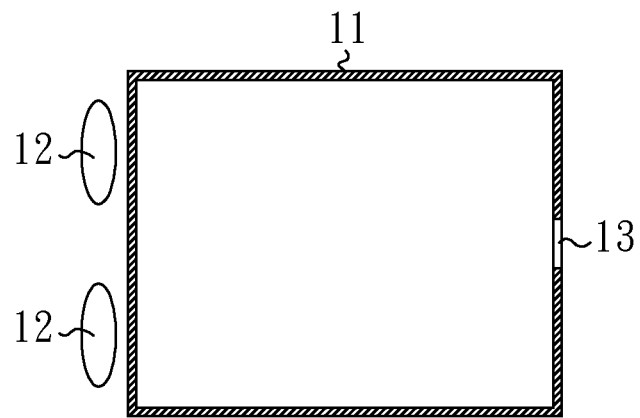
FIG. 1A and FIG. 1B briefly illustrate one apparatus embodiment.
Figure 1B:
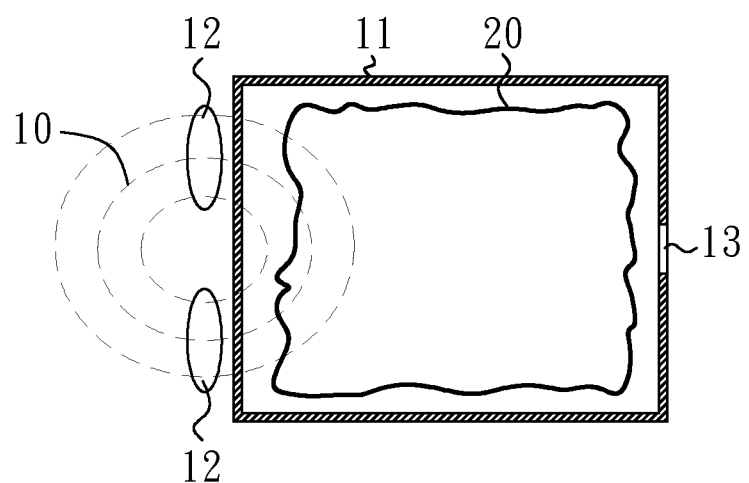

One embodiment of this invention is an ion source of an ion implanter. As shown in FIG. 1A, the exemplary ion source has at least a vessel 11 and one coil set 12. The vessel 11 is usually connected to some pipelines for delivering gas into the vessel 11 for providing the materials required to form the plasma inside the vessel 11. Herein, these pipelines, even other hardware parts of the ion source, such as the source housing, are not illustrated for simplifying the related drawings. On a first side of the vessel 11, there is an extraction slit 13 through which numerous ions may be extracted from the plasma to form an ion beam outside the ion source. Particularly, the coil set 12 is positioned outside the vessel 11 and proximate to a second side of the vessel. The excitation coil 12 has two sets of windings, such that the windings of one set do not overlap the windings of the other set, with the line from the center of one set of windings to the center of the other set approximately parallel to the extraction slit 13. Said coils may be connected to each other electrically. The number of turns per coil in this embodiment is two, where the turns are positioned so that they would mostly overlap the second side of the vessel when projected normal onto that second side. The two coils may be connected in series so that the current after passing through one then passes through the other and then to the circuit return. In some embodiments, there may be rf/VHF power supplies which are connected to the excitation coil 12 and the winding direction of the turns of each set may be such that the generated magnetic fields from the two sets of windings are opposite in direction and roughly equal in magnitude. In this case the field lines, 10, are distributed in part as shown in FIG. 1B with roughly zero net magnetic field entering the second side of the plasma vessel, 11. The illustrated field lines 10 from one coil enter the source volume through the second side, and then after passing within the volume near the second side, emerge and pass through the second coil. These magnetic field lines 10 may only slightly penetrate the volume within the vessel due to the diamagnetism of the plasma 20 therein. Clearly, while a plasma is being sustained inside the vessel 11, the inductive magnetic field may transmit energy into the plasma and lead to ionization, dissociation and other atomic or molecular reaction inside the plasma. Hence, the plasma can be maintained continuously when numerous ions are continuously extracted from the vessel 11 via the extraction slit 13 and the injected materials are continuously ionized.

Nevertheless, the existence and the function of the coil set 12 are not dependent on how the plasma is ignited. In other words, although not particularly illustrated, the proposed ion source may in some embodiments employ an independently powered and controlled rf or dc cathode to ignite the plasma. However, after the plasma has been ignited the cathode may be tuned off because the coil set 12 can provide the rf/VHF magnetic field to maintain the plasma. Thus, some disadvantages may be improved. For example, the migration of metals induced by the combination of the hot cathodes and the chemistry inside the ion source will be improved because the temperature of the cathode will be lower at least during the period of maintaining the plasma.

In alternative embodiments, the plasma may be ignited by the capacitive coupling from the coil set 12 to the volume within the source (or viewed as within the vessel 11). Significant electrostatic rf/VHF electric fields (obeying Curl (E)=0) can be created within the source volume by the high ac voltages on the coils. Such high coil voltage is developed due to the coil inductance when substantial rf/VHF currents are driven through the coil(s). This electric field can cause electrical breakdown within the source volume which causes the electron density to rise (avalanche). Once the electron density rises over a threshold, the rf/VHF induction field takes over as the main driving power source sustaining the plasma.

Further, for the example shown in FIG. 1A, the second side and the first side of the plasma source may in some embodiments be opposite to each other, and then the coil set 12 are opposite to the extraction slit 13. In some embodiments (not shown herein) the second side may be adjacent the first side rather than opposite it. In this case the coil may be asymmetrically placed on one side or other of the vessel or on both. In some embodiments the second side may be rounded so that it joins with the first side along edges which are roughly parallel to the extraction slit. In some embodiments the source vessel may be rounded—with circular or elliptical cross section so that the coil may be adjacent said rounded vessel wall at some angular distance from the extraction slit. Further, in some embodiments, the two sets of windings may have a shape and configuration that is symmetrical about a plane that intersects the extraction slit 13 at its midpoint in the longer direction. In some embodiments, the upper and lower sets of windings of the excitation coil are not symmetrical in shape or configuration but may be approximately symmetric in the rf/VHF power injection into the plasma within the source. Such coil configuration has a significant advantage that the generated magnetic field shown in FIG. 1B inside the vessel 11 is mostly parallel to the long direction of the extraction slit 13 and mostly contained in a volume of a few centimeters depth that extends over a significant fraction of the area of the second side. It is within this volume that the power from the excitation coil is transferred to the plasma. Note that the beam height of the extracted ion beam is parallel to the long direction of the extraction slit 13 because the ion beam is extracted away from the vessel 11 via the extraction slit 13. In general, it is desirable that the rf/VHF power injection into the plasma be approximately symmetrical about the midplane perpendicular to the extraction slit so that the ion density proximate to the extraction slit will be symmetrical about said midplane. Further, it is desirable that the power injection into the plasma from the coil set 12 be such that the ion density proximate to the extraction slit will be as nearly constant as possible along the length of the slit. This is beneficial because then the ions extracted from the slit will have as nearly uniform acceleration and focusing in the dc electric field provided to form the ion beam for implantation. Hence, the extract ion beam will have essentially best focusing properties along the entire length of the extraction slit 13.

Nevertheless, only for generating the inductive magnetic field to maintain the plasma, the invention needs not limit the potential variations related to the coil set 12. Some non-illustrated examples use such excitation coil that have more than two sets of windings to provide more fluxes of the inductive magnetic field into the vessel 11. That is to say that the number of the sets of windings of the excitation coil 12 is not limited. In such situations, these coils usually are positioned in a plane parallel to the second side as shown in FIG. 1A, so that the distribution of the inductive magnetic field may be more uniform inside the vessel 11. Other non-illustrated examples may use one, two, odd number or even number of sets of windings to form the excitation coil 12, so that the distribution of the inductive magnetic field inside the vessel 11 may fit different potential requirements on the ion current distribution of the beam extracted through the extraction slit 13. Moreover, to effectively transmit the inductive magnetic field into the vessel 11, the only requirement is that the coil set 12 being positioned proximate to the vessel 11. Hence, other non-illustrated examples may position the coil set 12 proximate to any side of the vessel 11. In others, the second side may be adjacent to the first side or any side not opposite to the first side. The two coil sets 12 may be adjacent to the first side of the vessel 11 respectively. In each situation, the configuration of the coil set 12 may be optional to be symmetrical about a plane that is perpendicular to the extraction slit 13, and bisects it. Further, in some embodiments said coil may be roughly symmetrical about a plane that bisects and is parallel to the long direction of the extraction slit and to the direction of beam propagation immediately after extraction.

As shown in FIG. 1B, the interaction between the electrostatic electric field produced by the excitation coil and the plasma will oscillate the electrical potential of the plasma, and as a result, the ion energy may oscillate following the rf/VHF signal and in this event therefore the extracted ions will not all originate with the same energy. This leads to greater spread in the energy distribution of these extracted ions via the extraction slits 13. Further, for the configuration shown in FIGS. 1A and 1B, when the coils set 12 is positioned outside and proximate to the vessel 11, the distance between the coil set 12 and the plasma inside the vessel 11 is small with no other structure intervening so that the capacitive coupling with the plasma is unavoidable. Hence, the energy spread of the ions inside the plasma will be increased. This effect can be mitigated to some degree by making the coils larger (but still not overlapping) and positioning the coils so that the distance between the coils and the plasma is increased which means the capacitance between the coil and the plasma may be substantially reduced. While this also causes the efficiency of rf/VHF power transmission to the plasma to be reduced, the source can still operate. In some embodiments (not shown) two sets of windings are positioned at a distance from the plasma vessel roughly equal to or greater than the average radius of a winding, and there is a cover shield which is connected to the reference potential for the ac power generator and is adjacent to or forming a substantial fraction of the surface area of the source, and the rf/VHF voltages on the windings are equal in magnitude and opposite in polarity.

Figure 2A:
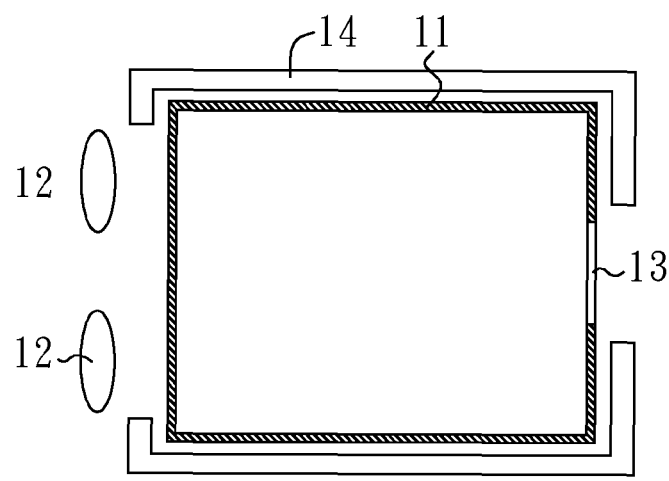
Figure 2B:
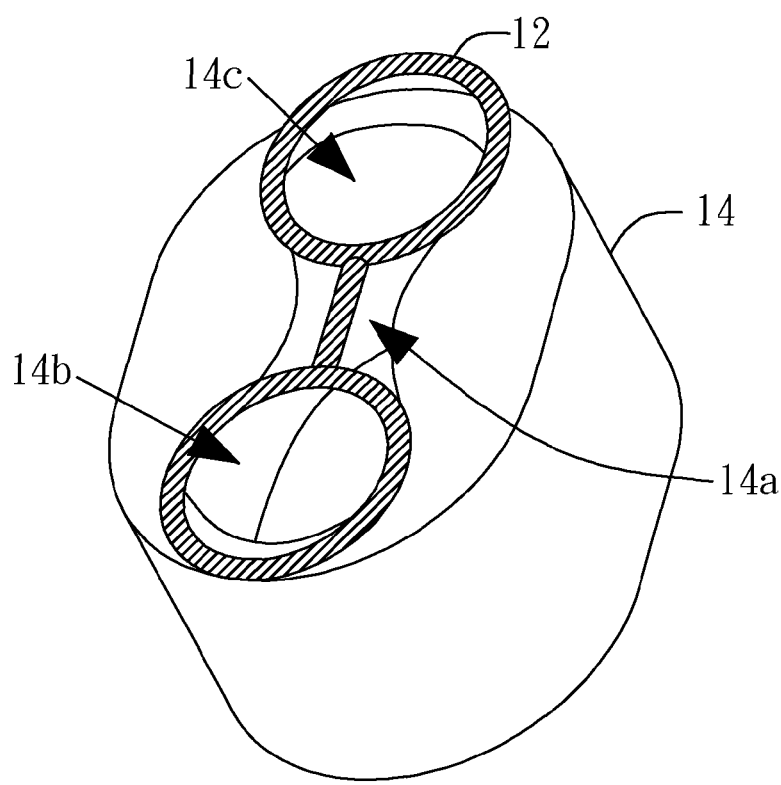

Accordingly, the invention has two more exemplary embodiments which can minimize the width of the energy distribution of the extracted ion beam. Both exemplary embodiments have one vessel 11, one coil set 12 and one extraction slit 13 as discussed above. Further, as shown in FIG. 2A, one exemplary embodiment has an electrically conducting shield 14, which may called as the "cover shield", being positioned surrounding the vessel 11 and covering a large portion of the wall of the vessel 11 (or viewed as covering a larger portion of the interior of the vessel), wherein at least the extraction slit 13 and part of the second side proximate to the coil set 12 are not covered. FIG. 2B is a 3-D view of a conceptual rendering in some embodiments of the coil 12 positioned relative to the cover shield 14 that surrounds much of the plasma source vessel. It is visible herein that the opening 14-a in the cover shield 14 is roughly the same shape as the coils of the coil set 12 and there are wider areas 14-b and 14-c at the ends of the opening that permit penetration of the magnetic field. Further, as shown in FIG. 2C, another exemplary embodiment has a conducting shield 15 which may be called the "coil shield", being positioned between at least part of the coil set 12 and the second side of the vessel 11. This coil shield 15 in some embodiments may be electrically connected to a circuit (not shown) having a tunable reactance and low resistance so that the voltage of the conducting coil shield 15 is tunable. Alternatively, the coil shield 15 may be connected to an adjustable rf/VHF voltage source having the same frequency as the power for the coils. The phase and the amplitude of the applied voltage may then be chosen so as to compensate or nullify the voltage on the coil shield 15 that would otherwise be imposed by the capacitive coupling from the coils resulting in a near zero rf/VHF voltage on the coil shield 15.

The cover shield 14 in FIG. 2A usually is connected to the support structure for the source which is at the common potential of the housing of the rf/VHF power supply system, and which may have a high dc voltage. Optionally, the rf/VHF voltage amplitude may be less than about 20 Volts when the ion source is having ions extracted for ion implantation. Hence, these rf/VHF currents inside the plasma may be collected by the cover shield 14 and carried away from the plasma inside the vessel 11. Therefore, the risk of increasing energy spread of ions may be minimized. The coil shield 15 in FIG. 2C may in some embodiments be controlled by an external controllable supply or in some embodiments by adjusting the operation of a reactive circuit so that it has a very small rf/VHF potential. Hence, the capacitive coupling with the plasma may be blocked in part by the conducting shield 15, so that the risk of increasing energy spread of ions may be minimized.

The cover shield 14 in FIG. 2A and the coil shield 15 in FIG. 2C reduce the energy spread of ions by different functions. Hence, optionally, the proposed ion source may have only one of the cover shield 14 in FIG. 2B or the coil shield 15 on FIG. 2C, but also may have both cover shield 14 and coil shield 15, or even may have neither of the cover shield 14 or the coil shield 15. Further, shields 14 or 15 can each be made of one conducting element or more than one conducting element.

Furthermore, the coil shield 15 can have more functions than reducing the energy spread of ions. Since coil shield 15 in some embodiments may be more proximate to the vessel 11 than the coil set 12, this coil shield 15 may strongly affect the plasma potential inside the vessel 11. When the rf/VHF potential on the shield is substantial—in some cases it may be as much or more than 100 Volts peak-to-peak—the rf currents driven into the plasma may be substantial resulting in a significant modulation of the plasma potential. The coil shield itself is coupled capacitively to the coil and receives rf/VHF current from it and may also have connections to other reactive elements or power supplies to control the voltage on it. Therefore, there can be multiple functions performed by shield 15. For example, before the plasma is generated inside the vessel 11, the rf/VHF voltage of the coil shield 15 may be made high to apply a strong rf/VHF electric field inside the vessel 11 so that the injected gases of required species of the plasma are initially broken down to generate a plasma. In such situation, there is significant capacitive coupled rf/VHF current from the coil shield to the plasma, which helps ignite the plasma under various source conditions. Thus, once the plasma is steady and being sustained by inductive coupling, the voltage of the coil shield 15 may be adjusted to be as near zero as possible and the plasma may be maintained almost entirely by the inductive magnetic field alone from the coil set 12 under normal operating condition.

The area of the coil shield relative to the combined areas of the cover shield and first side is important in determining the range within which the modulation of the rf/VHF plasma potential may be controlled. Larger areas for the coil shield relative to that of the combined cover shield and first surface result in larger maximum values for the rf/VHF plasma potential modulation. In some embodiments where the area of the coil shield may be between 20% to 30% of the combined areas of the cover shield and first side of the source (within which is the extraction slit), the modulation of the plasma potential may be of the order of magnitude of 10% of the rf/VHF voltage of the coil shield. In some embodiments where the area of the coil shield may be approximately the same size as the combined areas of the cover shield and front side of the source, the magnitude of the plasma potential modulation may be about half the magnitude of the modulation of potential of the coil shield. Consequently, sheath potential adjacent the first surface—the wall in which there is an extraction slit—may be roughly the same voltage as that adjacent the wall covered by the coil shield. In this latter case, the minimum modulation of the plasma potential that can be achieved by tuning will typically be larger than the minimum when the area of the coil shield is a small fraction of the area of the cover shield and first surface of the source. Substantial modulation of the plasma potential is not necessary for ignition of the plasma but may expedite ignition. So in case there is no other purpose for plasma potential modulation a smaller area for the coil shield—between about 5% and 25% of the combined areas of the cover shield and the first surface may be sufficient for the ion source.

In embodiments of the ion source where in-situ cleaning of residues on interior source walls is needed with some frequency but manual residue removal must be done much less often, it may provide benefits to have the rf/VHF plasma potential be at least 30 Volts or more. For cleaning the source walls, a reactive gas may be fed into the source to generate plasma containing highly reactive radicals that can etch the residues on the inner walls of the source. Then, once a dense plasma is formed within the source by inductive coupling, the rf/VHF voltage on the coil shield may be adjusted. Substantial plasma potential modulation may be important for complete and fast cleaning of the source interior walls. In some embodiments, the wave amplitude of plasma potential modulation may be at least about 20 Volts, so that combined with the dc plasma potential there is a significant dc potential difference from the plasma to the walls of the vessel 11, so that the ions inside the plasma are accelerated to a sufficient energy to cause more rapid cleaning by ion enhancement of the etching process. In some embodiments the dc plasma potential is less than about 100 Volts so that sputtering of the walls is minimized. Clearly, the collision between the accelerated ions and the wall surface activates surface reactions of species produced in the gas phase with residues to clean the inner surface of the vessel 11. In other words, the coil shield 15 provides a useful additional function which is to increase the rate of in-situ cleaning of the vessel 11. This allows rapid change from use of one type of gas to produce an initial species of ion beam, to a new gas source and a second different species of ion. This increases the flexibility of the ion implanter and its usefulness to IC manufacturers. Additionally, it reduces the needed frequency of manual cleaning of the source vessel, and thus the required cost and operation of cleaning vessel 11 may be lowered. Note that this can happen with capacitive coupling to increase the energy of the ions striking the source wall which speeds the etching reactions of reactive atoms (usually fluorine, chlorine, or in rare cases hydrogen).

In some embodiments of the source, for plasma-enhanced in-situ cleaning it is desirable to have ion energies bombarding all interior surfaces of the source approximately of equal magnitude during cleaning so that residues on all interior surfaces are cleaned at approximately the same rate. This helps avoids uneven cleaning due to some surfaces having higher power density of ion bombardment. In such uneven cleaning surfaces cleaned first would then be etched or sputtered likely shortening the useful life of the source, or causing deposition of said wall material onto other surfaces.

In order to accomplish such balancing of the sheath potential it is essential to properly proportion the area of the coil shield relative to the combined areas of the cover shield and first surface of the source. In some embodiments of the invention the area of the coil shield is approximately equal to the combined areas of the cover shield and first surface. In some embodiments there are areas of the coil shield that extend beyond the area between the coil and source, and may cover, in part or wholly, sides of the source in addition to the second side. In some embodiments, all or part of the conducting structure which has been called the "coil shield" may be mounted to and supported physically by the cover shield or the source or the housing for the source, though it is not connected electrically to said supporting structures. This structure may have multiple segments that are not physically connected but are electrically connected and each segment may have slots or openings.

A function of said "coil shield" structure in some embodiments is to intercept ac current transmission into the plasma by blocking the direct capacitive or electrostatic coupling that would otherwise occur between the coil and the plasma. In some embodiments another function is to controllably transmit a desired rf/VHF current into the plasma of the ion source to cause a desired magnitude of rf/VHF modulation of the plasma potential. The functions that can be performed by virtue of such control during the different phases of the ion source's operation are: minimizing ion energy spread during ion implantation; providing sheath potentials adjacent interior source walls sufficient to enhance plasma-enhanced in-situ cleaning of the interior of the ion source; and when readying the implantation system for processing wafers to provide sufficiently large ac electric fields in the source volume to ignite the plasma in the source.

Accordingly, as the brief flowchart shown in FIG. 3, one exemplary embodiment is a method of operating an ion source of an ion implanter. Initially, as shown in block 301, prepare (such as set up, maintain, turn on or other actions) an ion source which has a vessel, a coil set, a coil shield, a power generator (such as rf/VHF generator, i.e., a generator of ac power in the appropriate frequency bands) and means for adjusting the rf/VHF voltage of the coil shield. The coil set is positioned outside the vessel and proximate to the wall of the vessel, the coil shield is positioned outside the vessel, between the coil set and the wall of the vessel, and the power generator is electrically connected (typically through an impedance matching network) to the coil set. The coil shield is electrically connected to an adjustable reactance or to an independent source of rf/VHF voltage having the same frequency as the coil, so that its voltage may be controllably varied. Then, as shown in block 302, the implanter control system may adjust the operation of both the power generator and the shield voltage control means to perform at least one of (e.g., one or more of) the following: cleaning the vessel, igniting a plasma inside the vessel, or maintaining a plasma suitable for ion implantation therein. Herein, the vessel may be cleaned in some embodiments by maintaining the RF/VHF power to the coil, at a lower power setting and providing a gas that is a source of etching species F, Cl or H, and tuning the reactance or rf/VHF voltage source to the shield thereby increasing the rf voltage on the coil shield so it causes the rf plasma potential to rise and ion bombardment of interior walls of the vessel to increase. Thus, during such action the coil set continues to receive any RF/VHF current and generates any ac inductive magnetic field into the vessel, also the conducting coil shield maintains the higher voltage that will transmit rf/VHF current causing a higher plasma potential in the vessel. In alternative embodiments the power level of rf/VHF to the coils may be reduced to a low level or even to zero. In this case, in embodiments wherein there is a separate source of voltage to the coil shield, the plasma in the source may be maintained so that numerous particles, principally ions then bombard the inner surface of the vessel, and due to the higher energy of these ions promote more rapid cleaning.

Figure 4:
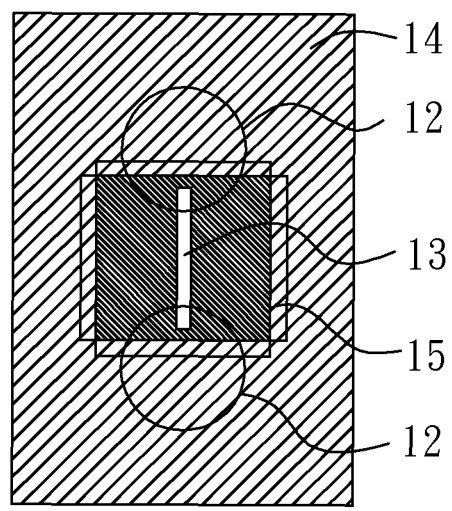
FIG. 4 briefly illustrates one apparatus embodiment.

To more effectively reduce the capacitive coupling with the plasma, it is optional that the line of sight from the coil set 12 to the plasma inside the vessel 11 is substantially (more than 90%) blocked by the cover shield 14 or the coil shield 15, or both the shields 14/15. For example, as the exemplary embodiment shown in FIG. 4 which is the back view of the ion source that looks through to the front side of the ion source, the line of sight from any portion of each coil of the coil set 12 to any portion of the plasma inside the vessel 11 is almost entirely blocked by both the cover shield 14 and the coil shield 15. Therefore, when the rf/VHF potential on the coil shield is tuned to be very small (less than or about 10 Volts) by appropriately setting the reactive element through which it is connected to the reference potential of source or generator, or by suitably adjusting the rf/VHF signal applied to it, the capacitive coupling of the coil(s) with the plasma inside the vessel 11 may be greatly reduced by the existence and the positions of both the cover shield 14 and the coil shield 15.

Figure 5:
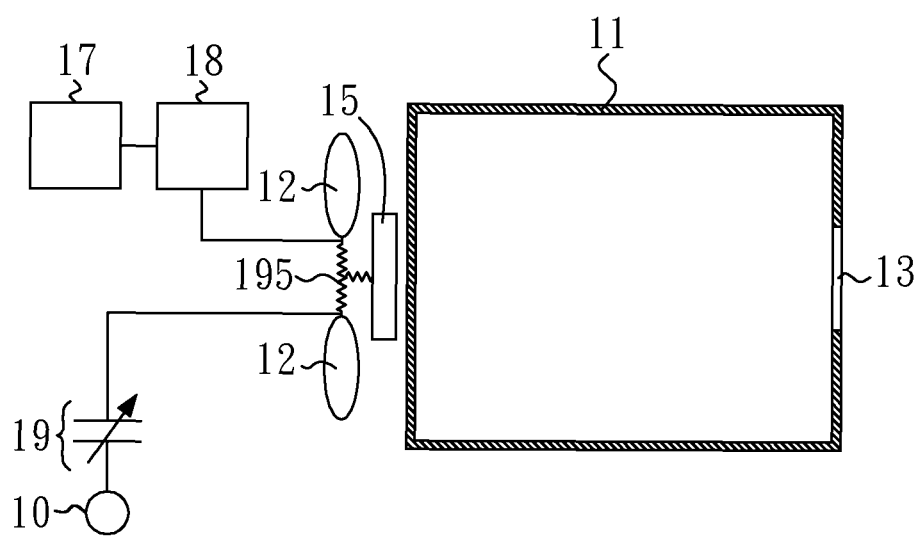
FIG. 5 briefly illustrates one apparatus embodiment

In additional exemplary embodiments of this invention, there may be a different configuration of the reactive element and connection of the coil shield that serves to control the voltage of the coil shield 15. As shown in FIG. 5, proximate to and outside a side of the vessel 11, the excitation coil 12 has two separated sets of windings each of which may have one or more turns, such as from one to ten turns. The coils are connected so the electric current that powers them flows in series from one to the other. The coil shield 15 is positioned at least in part between the two coils and the plasma vessel and is connected to an approximate midpoint of the electrical connection between the coils. An ac power generator 17 is electrically connected through an impedance match network 18 to a first end of a first coil (with inductance $L_1$ when positioned as shown in the assembly including housing, source, shields and second coil) of the coil set 12 and then the second end of the first coil is connected by an electrical conductor, 195, to a first end of the second coil (having inductance $L_2$ when positioned in the assembly) in sequence. The second end of the second coil is then connected to a terminal of the tunable capacitor 19, whose other terminal is in connected to the common potential of source and power supply housings, 10. Moreover, the current carrying line 195 also electrically connects the coil shield 15 to a point on the electrical connector carrying current from the first coil to the second coil. Clearly, the power generator 17 may provide a rf or a VHF electric current to the two coils of the coil set 12, and the impedance match network 18 may balance the impedance correspondingly. Hence, the coil set 12 may apply the inductive magnetic field into the vessel 11 which effectively passes through and/or around the coil shield. In some embodiments the two coils are wound so that their magnetic fields are approximately opposite in direction and approximately equal in magnitude and in this event the net magnetic flux directed to the plasma source from the combined coils is much less than it would be from either coil alone. The power generator 17 usually provides electric current with a specific frequency, such as 13.56 MHz, and in some embodiments within a range from about 200 kHz up to 100 MHz or higher, but the power generator 17 also may be designed to be able to provide alternating current with adjustable frequency. The adjustable capacitor 19 may have a range of capacitance with minimum value, $C_{min}$, such that, at the operation frequency of the power generator 17, ω, the magnitude of the reactive impedance of the capacitor (1/(iω$C_{min}$)) is greater than the magnitude of the reactive impedance of the second coil (iω$L_2$). This permits the capacitor to be set to a value, $C_{resonant}$ where the reactance of the capacitor approximately cancels the inductive reactance of the second coil resulting in a very low voltage at the midpoint of the coils and on the coil shield as well. This condition is close to the condition at which the rf/VHF plasma potential in the source is minimized resulting in an extracted ion beam with the smallest range of ion energies—providing the best ion beam focusing and control within the ion implanter.

The maximum value of the capacitor 19, $C_{max}$, may be at least 20% more than its minimum value, $C_{min}$, so that by adjusting the capacitance of the tunable capacitor 19, the rf/VHF voltage on the conducting shield 15 may then be adjusted over a sufficient range to provide a substantial rf/VHF voltage on the coil shield to both ignite the plasma within the source vessel and to elevate the plasma potential within the source to ion bombard the interior walls and facilitate and speed in-situ cleaning of the walls. Accordingly, exemplary embodiments allow the vessel 11 to be cleaned when the power generator 17 is providing rf/VHF power over a wide range and the tunable capacitor 19 is adjusted to provide a higher rf/VHF voltage on the conducting shield 15. Such a capacitor setting in exemplary embodiments allows the plasma to be ignited inside the vessel 11 and then as it is adjusted to the value $C_{resonant}$ allows the plasma to be maintained when the voltage of the conducting shield 15 approaches zero. In this case, the voltage on the center point of the current carrying line 195 also is approximately zero now, because the coil shield 15 is electrically connected to a point on the current carrying line 195 for the benefit of symmetric circuit. In addition, in some embodiments, the current carrying line 195 may be parallel to the extraction slit 13 for further enhancing the symmetric and uniform distribution of the ions inside the vessel 11.

Of course, the case shown in FIG. 5 is only an example which has some benefits such as low hardware cost and easy operation.

Figure 6A:
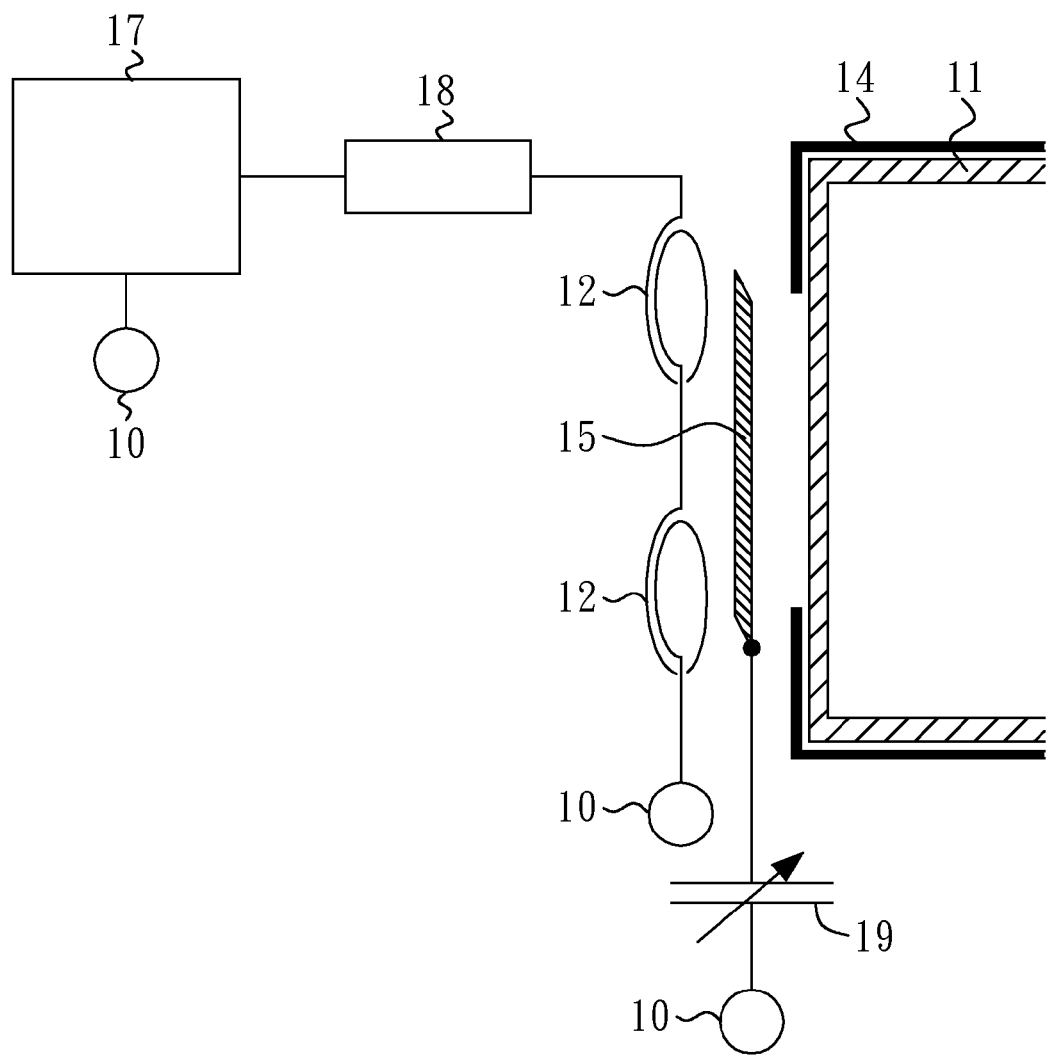
FIG. 6A to FIG. 6F illustrate some apparatus embodiments.

Other circuit configurations may have different ways of connecting the coil sets or shield to reactive elements or active rf/VHF components. For example, as shown in FIG. 6A, the coil set 12 and the coil shield 15 may be electrically separate, i.e., the output of the rf/VHF power generator 17 whose local ground is connected at a point 10 to the source reference potential is not electrically connected to the tunable capacitor 19 but simply to the excitation coil, 12, and thence to the source housing or reference potential, 10, for the ac power generator. In this case the coil shield 15 may be electrically connected through an adjustable capacitor to the reference potential, 10. In this case, for ignition or cleaning, the adjustable capacitor might be set at a value that causes it to have a higher rf/VHF voltage to provide a substantial ac voltage on the coil shield 15. On the other hand, for implanter operation having best ion beam properties the shield capacitor may be set with capacitive reactance equal in magnitude and opposite in sign to the inductive reactance of the line to and thereby almost completely nullify the reactance of that inductance resulting in effective grounding of the shield 15. The two sets of turns 12 in some embodiments may be wound with the turns in planes that are parallel or at an angle that may be up to about 90 degrees. The two sets of turns are connected in series and in some embodiments the second set of turns may be wound in the opposite direction from the first set so that when an electric current flows through both the magnetic field directions for the first coil and second coils are between 90 degrees (at right angle) and 180 degrees (opposite).

In some alternative embodiments the coils may be wound so that magnetic fields of the two sets of turns may be parallel or at an angle up to about 90 degrees. In such embodiment there may be a split or segmented source shield so that ac magnetic flux may better penetrate into the vessel and reduce induced counter currents in the source shield.

Figure 6B:
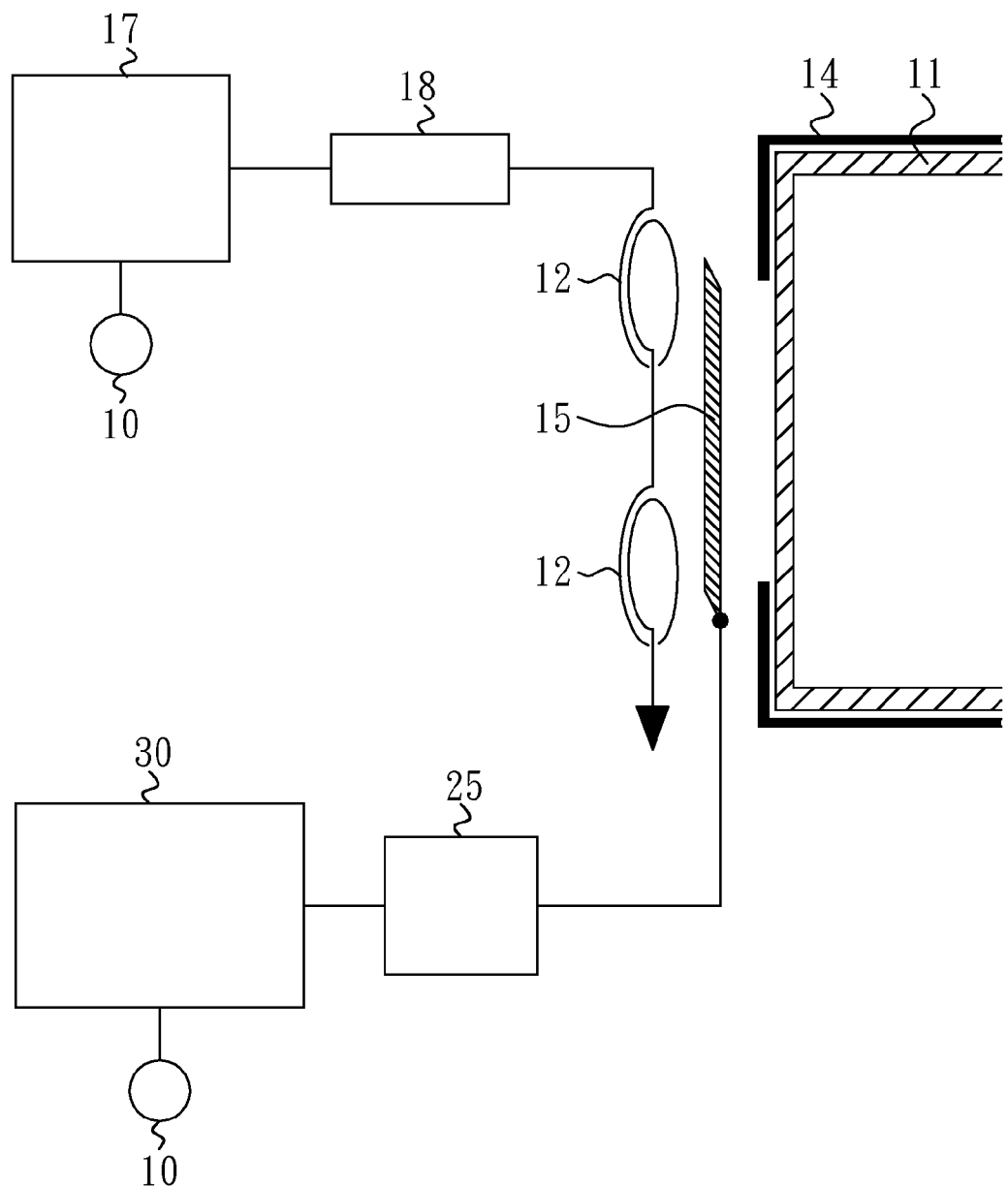

In some embodiments as shown in FIG. 6B the coil shield 15 is connected to an external bias supply 30 whose reference ground is electrically connected to a point 10 having the reference potential. Such bias supply is a controllable source of rf/VHF power connected through a controllable impedance matching network, 25, that may also act as a directional coupler, combined to provide rf/VHF current having controllable phase and magnitude, at the same frequency as the rf/VHF power source for the coil, 17. This power may be controlled so the net voltage on the shield will have magnitude within ranges of values appropriate for different processes. This net voltage, $V_{net}$, will be the vector sum of the voltage induced by the capacitive coupling from the coil, $V_c$, or antenna, and the applied voltage from the external bias supply, $V_b$,—where the phase angle between these voltages is θ, $V_{net}$=Sqrt(($V_c$)²+($V_b$)²+2 ($V_c$)($V_b$)Cos Θ). First, when it is desired to either ignite the plasma or perform a plasma clean of the source vessel, the phase and magnitude of the applied voltage may in some embodiments be such as to cause the rf/VHF voltage on the shield to be within the acceptable limits. In some embodiments for striking the plasma the magnitude of the applied voltage should result in a net voltage on the coil shield 15 with amplitude of at least 20 Volts. In some embodiments for cleaning the vessel the sum of the applied and induced voltage should cause the net voltage to be between about 30 Volts and about 500 Volts. When ions for implantation are to be extracted from the ion source it is desirable to make the net rf/VHF voltage on the shield as small as possible. Therefore, for this circumstance the applied voltage should roughly be equal in magnitude to $V_c$, the capacitive coupled voltage, but have a phase angle θ that is approximately 180°. In this way $V_{net}$ will be very near zero.

Figure 6C:
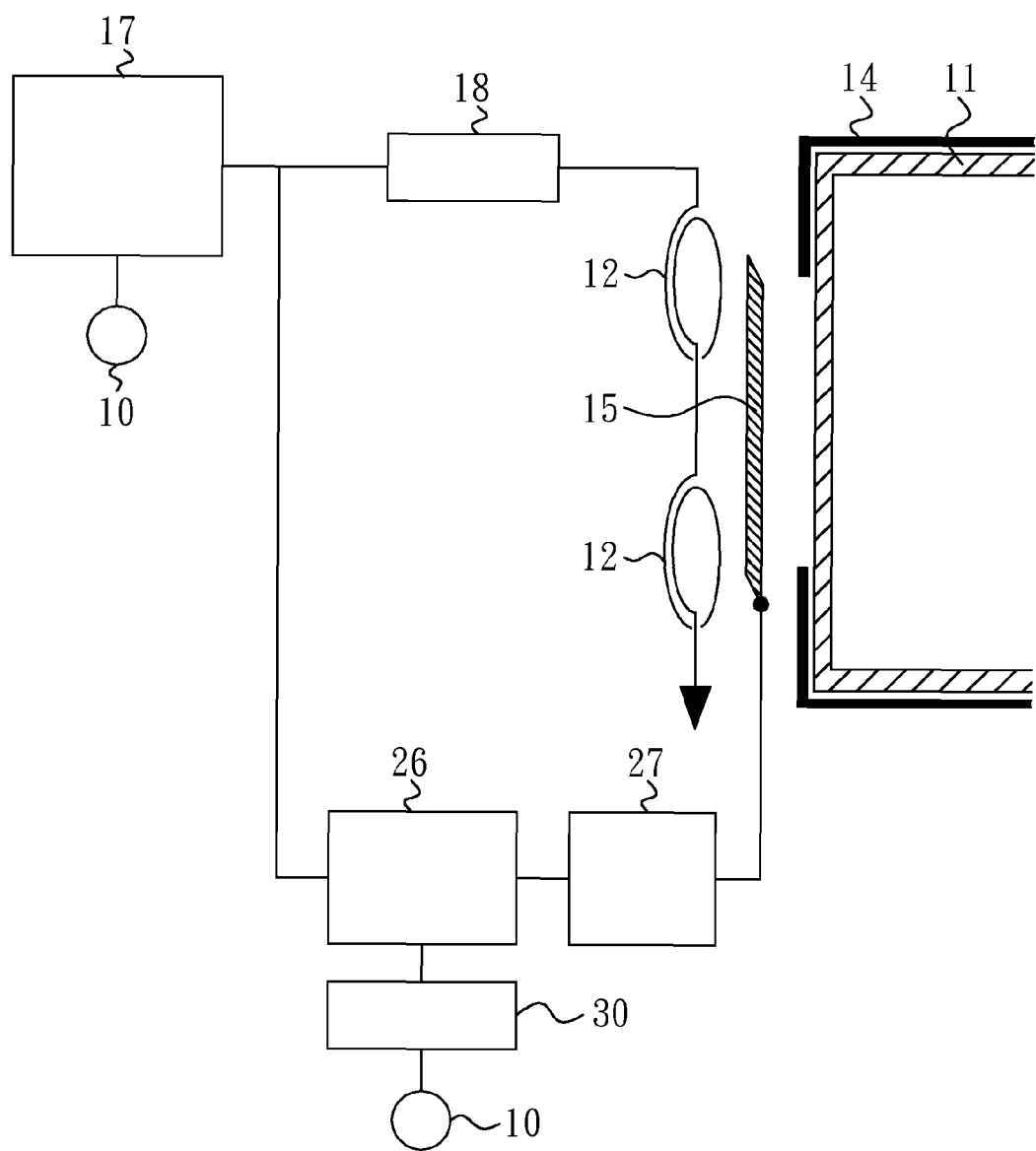

In FIG. 6C we see yet another configuration—one in which the coil shield 15 is driven by the same power source 17 as the coil 12 but by use of an attenuator 26 and a phase shifter/directional coupler 27, where the attenuator and phase shifter are controlled by a controller 30 whose local grounding point 10 in some embodiments may have the same potential as that of the local ground 10 of the rf/VHF generator 17. In this case again, the controller sets the voltage level on the coil shield 15 appropriate for the particular stage of the process, whether ignition of the plasma or cleaning where the net voltage on the shield should be higher, in roughly the same ranges as shown above for FIG. 6B. And for normal operation as an ion source the applied voltage should just cancel the capacitive coupled voltage on the conducting coil shield 15 to minimize the rf/VHF voltage on the plasma potential in the source.

Figure 6D:
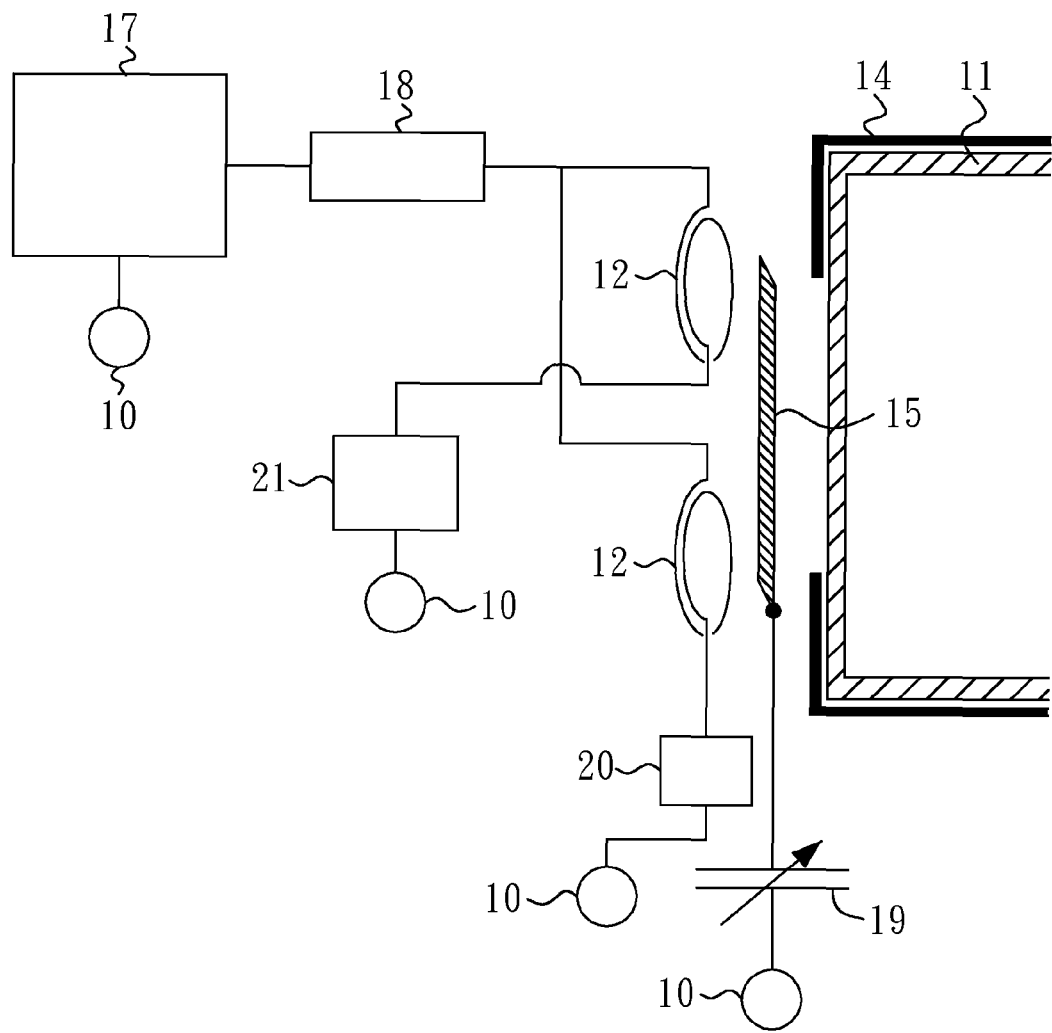

In FIG. 6D, we see yet another electrical configuration where the two coils 12 are driven in parallel rather than in series so that they have similar voltages and induce substantial voltages on the shield by capacitive coupling. In some embodiments the coils may be separately connected through reactive elements 20 and 21 respectively to a local grounding point 10 that is at the reference potential for the source. In some embodiments the turns of the coils may be wound in opposite directions so that the magnetic field of one of them is opposite in direction (or phase) to the magnetic field of the other. When there is a net reactance of the circuit connecting the shield to ground, such as greater than about 20 Ohms, $V_c$ the shield voltage may be large enough for ignition and cleaning. This can be achieved easily by tuning the variable capacitor 19 to very low capacitance values—as low as 10 pf. This causes the reactance of the circuit connecting the shield to ground to be very high and the shield voltage to be quite high such that rf/VHF electric fields in the source are sufficient that the plasma will be struck. Once the plasma is struck, in case it is desired to do cleaning of the vessel, the high impedance setting (or alternatively a much lower impedance) of the capacitor should be maintained so as to direct at least about 5% of the current coupled from the coils to the shield be further capacitively coupled into the plasma. In some embodiments the shield voltage induced in this situation may be as high as one thousand volts or more, depending on the capacitance from coils to shield and the ratio of areas of the shield 15 to that of the cover shield 11. Finally, when it is desired to extract ions from the source for maximum ion current for implantation, in some embodiments the capacitor 19 should be set so that it offsets as closely as possible the inductive reactance of the line connecting the shield to the local ground which is at the reference potential for the source. In this case, the reactance of the variable capacitor just cancels the inductive reactance of the grounding circuit and therefore yields very nearly zero impedance to ground from the shield. In this case the shield is effectively rf/VHF grounded and the capacitive coupling into the plasma and plasma rf/VHF potential are minimized.

Figure 6E:
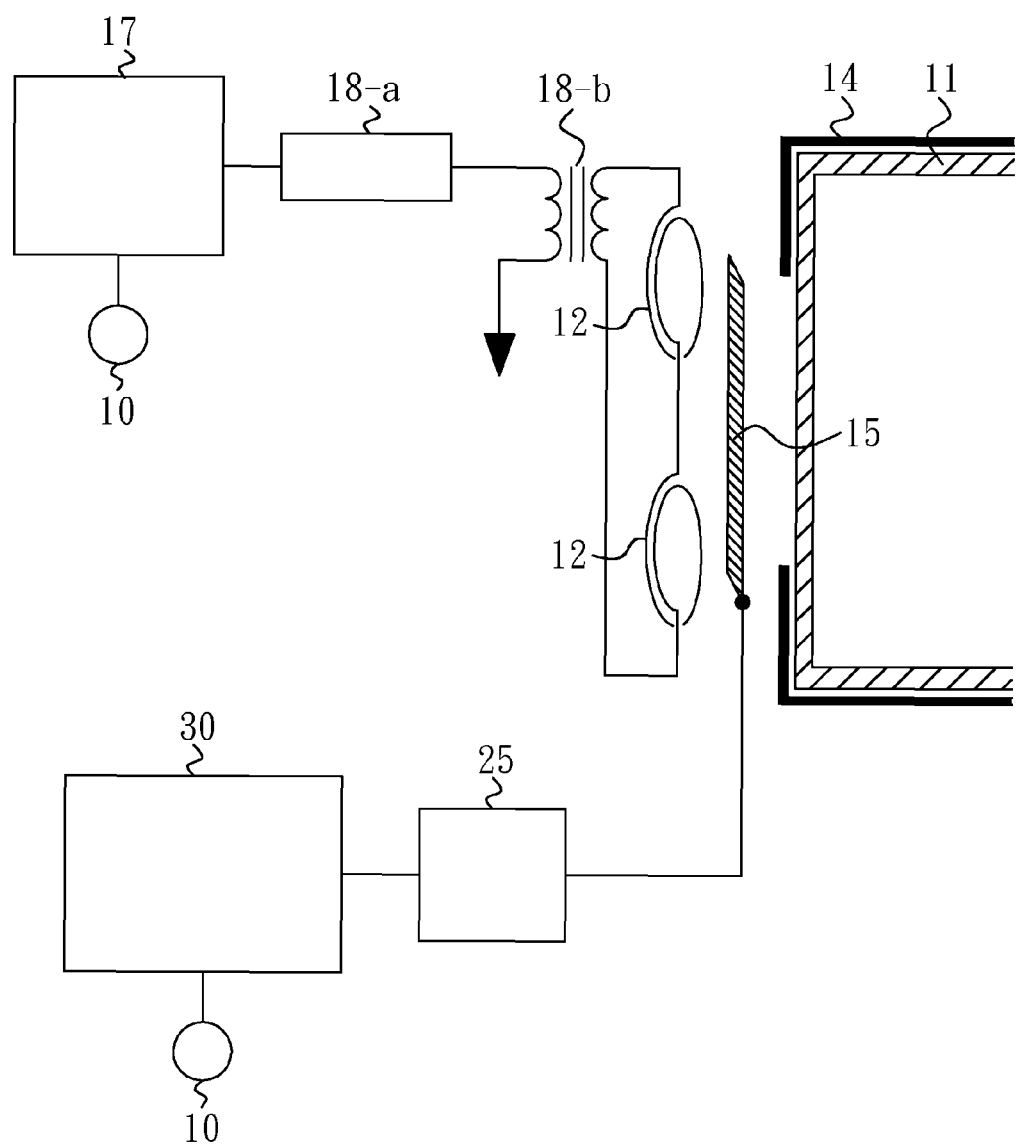

In FIG. 6E we see yet another configuration of the power provided to the coils with the shield again connected to a power supply and matching network whose local grounds may be connected to a point 10 whose potential is within 5 Volts of the reference potential. The rf/VHF power from the matching network 18-a is connected to the primary of a transformer 18-b and thence to ground while the secondary winding is connected at one end to a first end of the first coil and at the other end to the second end of the second coil. In exemplary embodiments the center-tap of the secondary of the transformer may be directly connected (connection not shown) to the coil shield 15 or may be connected through a capacitor (not shown) to local ground or to the coil shield 15.

Figure 6F:
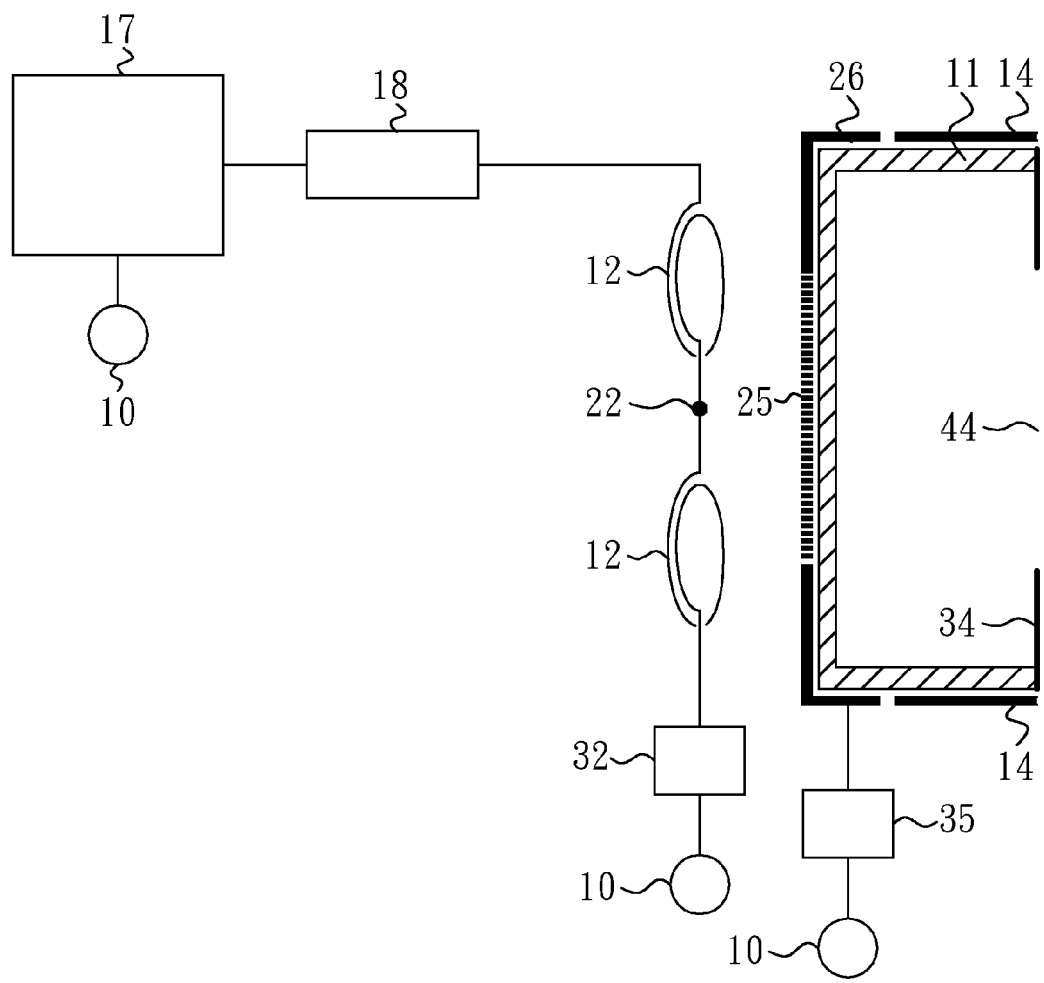

In FIG. 6F is shown a configuration of the invention representing alternative embodiments of an ion source in which there is a shield around the source—that may be called the source shield—said shield having at least two parts that are not directly connected to each other electrically. Said shield in some embodiments may in some areas actually be the wall of the source that is in direct contact with the plasma. In some embodiments there may be no coil shield physically supported by or proximate to the coil. In some embodiments of said ion source the rf/VHF current from the generator 17 and impedance match network 18 passes in series through the two sets of windings of the excitation coil 12 and then may pass through a reactive element 32 and then to a point whose potential is near the reference potential of the source. In some embodiments the combined parts of said multi-part shield cover at least 25% of the surface of the plasma source, and there may be openings and slots in one or more parts of said shield through which the source may have lines of sight to the coil or other components around the source (not shown). For said multi-part source shield there may be a first part 14 of the shield that may consist of one or more segments that are connected (connection not shown), either directly or through a low impedance of less than 10 Ohms, to the reference potential for the source which is also that of the rf/VHF generator and for the source housing. This reference potential may be elevated from earth ground by a dc power supply for the purpose of extracting the ions from the source. In some embodiments there should be very little rf/VHF component on said reference potential—less than 10 Volts peak-to-peak. In some embodiments there is at least one second part (e.g., one or more second parts) of the shield having segments 25 and 26, at least part of whose surface, mainly shown as segment 25, blocks lines of sight from the coil to the source. There may in some embodiments be additional part or parts of the shield (not shown) that are not electrically connected to either first (14) or second (25, 26) part and may be connected instead to separately controllable sources of rf/VHF power or adjustable reactive impedances (neither shown). In some embodiments the ratio of the area of the second part of the shield to the combined areas of the first part 14 and first side 34 (in which is located the extraction aperture or slit 44) of the source may be between about 0.1 and 0.6. This ratio controls the relative plasma sheath potentials adjacent the source walls corresponding to such areas. In some embodiments the second part of the shield may be electrically connected through an electrical component 35 to a point 10 having the source reference potential. Said component may be active such as a separate power supply for rf/VHF from that used to power the excitation coil, or may be passive such as a variable reactive element such as a capacitor. Said power supply may be controllable so that the frequency of the power to that part of the shield is the same as that powering the coil, and both the phase and amplitude of the rf/VHF signal may be controlled. This power supply may be controlled so that the amplitude of the rf/VHF voltage on said part of the shield may be made to be less than one Volt for the function of ion extraction, or made to have a greater Voltage for ignition of or cleaning of the ion source. Alternatively, the second part of the shield may be electrically connected to a reactive element that is tunable which may be a variable capacitor that has such range that its capacitive reactance can fully balance the inductive reactance of the circuit connecting it to the reference potential. In some embodiments the second part of the shield may instead be connected to the coil set at a point 22 on the conducting line between coils, or any point on a coil that is positioned behind the source. In some embodiments of the invention, the ratio of the area of the second part of said two part shield to the combined areas of the first part of the shield and the first side 34 of the source, may be from about 0.2 to about 0.8. In some embodiments the distances from the source wall of either segment of the first part or second part may be set such that the time-averaged capacitance of the plasma to the second part may be between 0.2 and 0.6 of the combined capacitances of the plasma to the first side and the plasma to the first part of the shield. In some embodiments the sheath potentials across a substantial fraction of the total area of all source walls will all be within a factor of about 2 so that during source cleaning the etching rates of residues over such areas may be within about a factor of 2.

There may be alternative shapes of the excitation coil and of the cover shield and coil shields 14/15 in FIGS. 5 & 6A-6F which may be of value for various particular applications such as an ion source with a much longer extraction slot, or for operation with different feed gases for alternative ion species, or to provide superior power coupling into the plasma to reduce the heat load in the high voltage stage of the implanter.

Figure 7A:
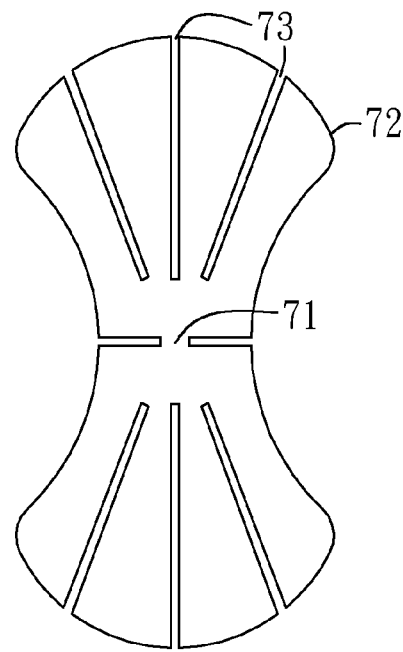
FIG. 7A to FIG. 7B illustrate some apparatus embodiment.
Figure 7B:
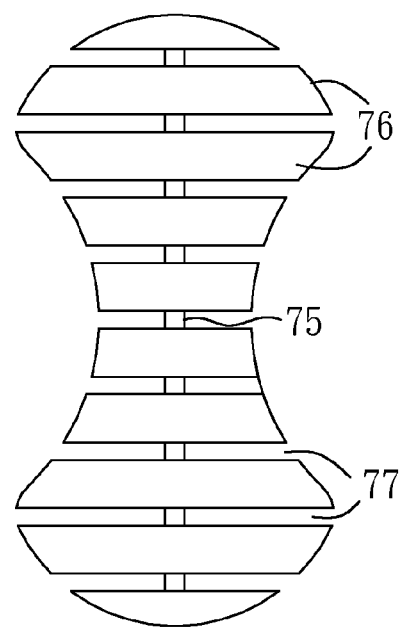

One such configuration of the coil shield 15 is shown in FIG. 7A. This may be made of electrically conducting material such as metal or silicon and may also contain insulating material—in some cases to strengthen its structure. In some embodiments, the coil shield 15 may be connected to either a capacitor or a power supply or to a coil or coil set at the centerpoint 71. The structure is divided as shown into segments 72 by slots 73 that prevent induction of large area eddy currents due to the penetrating magnetic field. In FIG. 7B we see an alternative design of coil shield 15 in which there is a central electrically conducting support strut 75 supporting the electrically conducting segments 76 which are separated by gaps 77 so that again large area eddy currents, which could prevent penetration of the magnetic field into the vessel and plasma, are blocked. In such way with either design 7A or 7B the rf/VHF magnetic field generated by the coils are able to pass through the coil shield 15 and into the plasma where they provide the energy for ion production. It should be noted that as shown in FIG. 2B the opening in the cover shield 14-*a* through which the magnetic field penetrates into the second side of the source may be shaped as shown so that one continuous area is penetrated by the magnetic fields from both coils. In some embodiments where the magnetic fields are of opposite polarity from the two coils and approximately equal in total flux then there will be approximately zero net flux through the opening into the plasma. In this case there will be no net induced current in the cover shield 14 that circulates around said opening. This optimizes the penetration of the magnetic field through the opening into the plasma and improves the efficiency of the ion source. The coil shields shown in FIGS. 7A and 7B are seen to have approximately the same shape outline as the opening in the cover shield 14 seen in FIG. 2B but with different slot patterns. In some embodiments the coil shield 15 may be slightly larger than the opening and may be mounted so as to cover most or all of the open area. The coil shield in some embodiments may have a plurality of segments which are electrically connected to each other but are not otherwise physically connected, and may be independently physically supported near the source. Such shield segments may have areas that combined cover at least 20% of the combined area of the sides of the source. Such segments may be positioned such that a majority of the area of one segment—such as shown in FIG. 7—at least partially blocks lines of sight from the coil while a majority of the area of a second segment (not shown) is not interposed between any part of the coil set and the vessel.

The coil shield 15 as shown in FIG. 7 may in some embodiments be mounted between the coils (which may be approximately co-planar with the second side of the source) and the second side of the source so it is approximately parallel to the planes determined by both. In some embodiments the coil shield 15 may be connected to the straight section 195 that connects the two coils in FIG. 5. In the embodiments the second coil may then be connected to a variable capacitor 19 as in FIGS. 5 and 6A which has a sufficient range of capacitive reactance to compensate for the combined inductance of the coil 12 and the circuit connecting it to the capacitor. In this way the coil shield rf/VHF voltage may be reduced nearly to zero while the plasma source is in operation. When both the cover shield 14 and the coil shield 15 have such low ac voltages it blocks the plasma from possible capacitively coupled currents that might flow from the excitation coil to the plasma that might otherwise cause substantial voltage oscillation in the plasma potential. The coil shield 15 shown may be slotted so that the magnetic fields from the excitation coil cannot induce counter circulating currents in the coil shield 15 that would prevent the magnetic field from penetrating into the vessel and energizing the plasma. Effectively, then the slotted coil shield allows the magnetic fields from the coils to penetrate very efficiently into the plasma while at the same time blocking the penetration of the electric field via displacement currents from the coils. In some embodiments the coil shield 15 may be physically supported by insulating standoffs from the cover shield 14 but electrically connected to the connector between the two coils. It may in some embodiments be advantageous if the coil shield 15 covers the opening in the cover shield 14 nearly completely except for the narrow open areas of the slots in the coil shield.

Figure 8A:
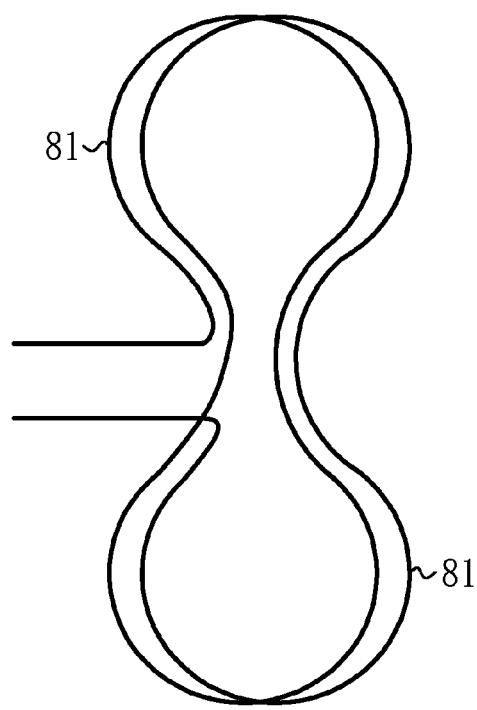
FIG. 8A to FIG. 8B illustrate some apparatus embodiments.

In alternative embodiments which may be represented in FIG. 8A the coil may be two turns or more with an elongated or "hourglass" shape so that the magnetic field direction from both lobes, 71 and 72, is approximately the same direction. In this case, the coil shield may have a shape as shown in FIG. 2B to block the capacitive coupling of current from the coil into the plasma. When such a coil 81 is used as in FIG. 8A there may be rf/VHF currents induced in the cover shield 14 which circulate around the opening in such direction to oppose the changing magnetic flux through the opening. In order to facilitate better penetration of the magnetic field and arrest such counter-currents the cover shield 14 may have one or more narrow splits which extend from the open area 14-*a* adjacent the second side of the source outward and then toward the first side of the source so that circulation of current around the open area due to magnetic field penetration is prevented.

Figure 8B:
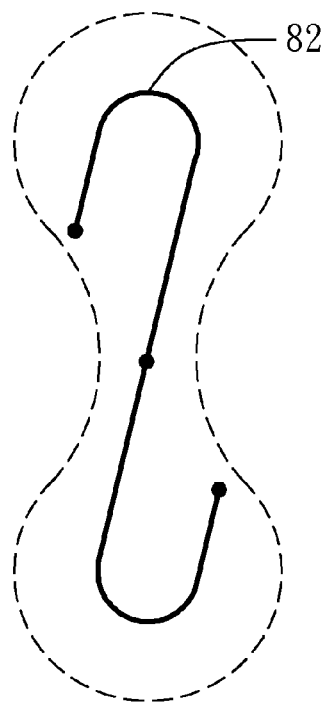

In alternative embodiments the power provided the coil(s) shown as generator 17 in FIGS. 6A-6F may have frequency over 100 MHz, potentially extending from the upper VHF band into the UHF band and even to the microwave band. To achieve efficient coupling of such power into the source an antenna or "coil" 82 as shown in FIG. 8 may be used. In this case a coil shield 15 such as that in FIG. 7B may be used to permit the VHF/UHF/μW magnetic field generated by the coil to penetrate into the plasma. Further, in this case in some embodiments a cover shield 14 may be used that has a single opening with an area that is similar to that in FIG. 2B. In this case, the capacitive coupling to the coil shield 15 may only produce low voltages on the coil shield 15 and since the frequency is so high this may induce substantially lower energy spread in the extracted ions. Thus, in these embodiments, it may be preferable for such antenna shape and higher frequency VHF/UHF/mW power source for the antenna, to de-couple the coil shield 15 from the antenna and instead couple it to an external power supply that has a lower frequency—preferably in the rf or VHF bands. In this way higher voltages may be transmitted to the coil shield 15 for both plasma ignition and for cleaning of the interior walls of the vessel 11. In some embodiments it may also be possible to attach the coil shield 15 physically to the cover shield 14 with an insulating fixture having a desired capacitance so that UHF or μW fields can only induce low voltages on the coil shield, but lower rf frequencies can drive substantial voltages on the shield for ignition or cleaning.

Figure 9A:
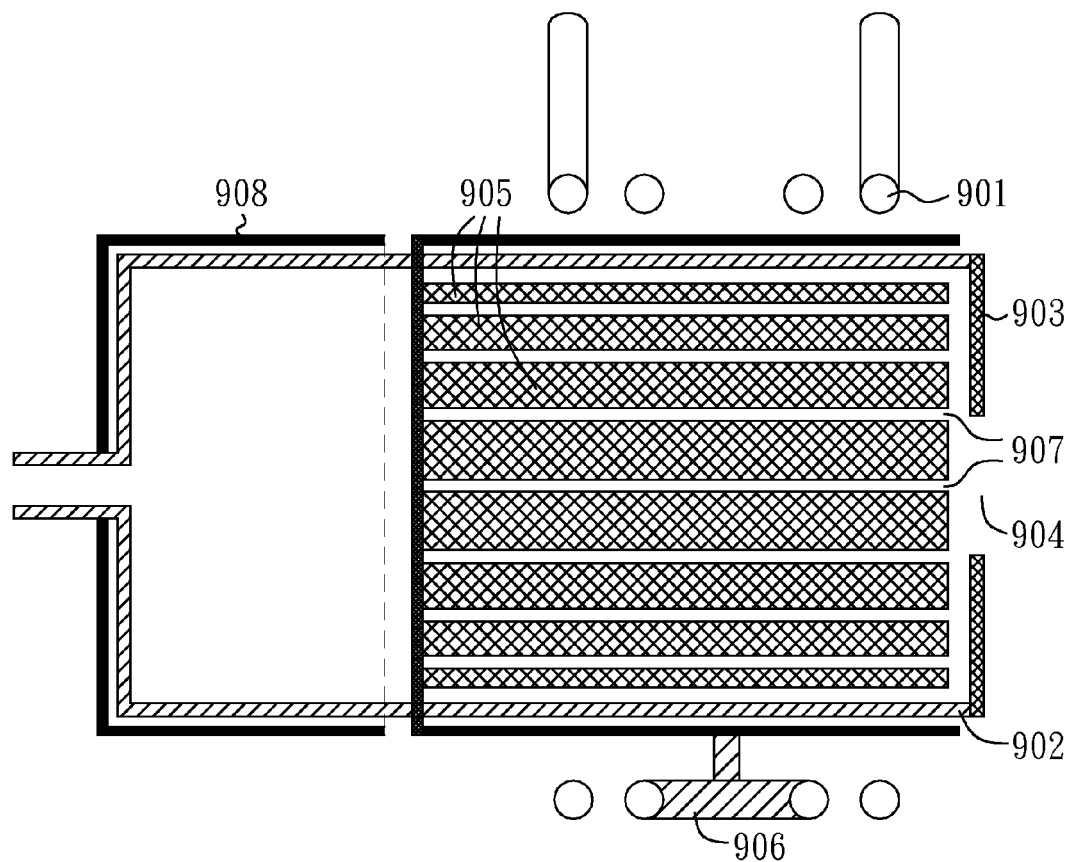
FIG. 9A to FIG. 9B illustrates two apparatus embodiment.
Figure 9B:
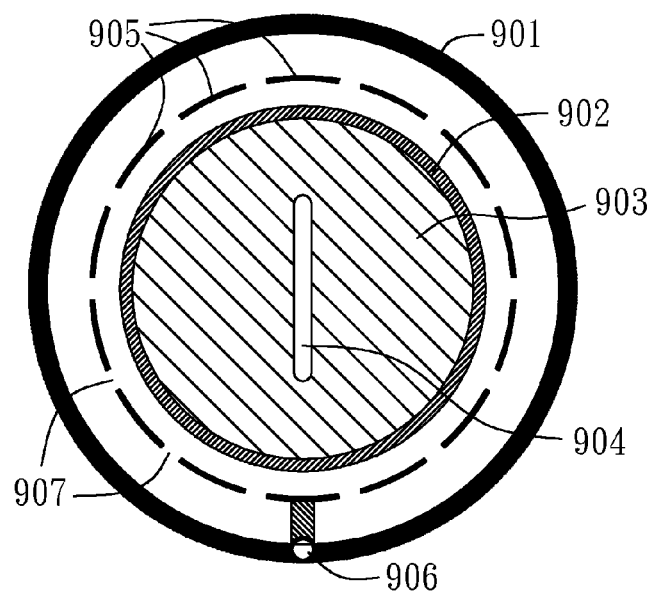

In FIG. 9A (side view) and 9B (front view) we illustrate embodiments of the ion source for implantation in which the excitation coil or set of coils 901 are wound circumferentially around at least a part of a plasma containment vessel 902. In some embodiments the coil set may be closest to walls of said containment vessel that are dielectric and which may be adjoining the first side of said vessel 903 in which the extraction slit 904 is located. In said ion source configuration there may be an electrically conducting coil shield 905, consisting of multiple electrically connected segments, that is interposed between said coil set and the dielectric walls and is connected electrically to a point on a coil, or connected electrically to a point on one of a set of coils, or to a conducting element 906 that electrically connects the coils within the set. Illustrated in FIG. 9 is a configuration as in some exemplary embodiments in which two approximately round coils 901 are connected in series and are wound around said vessel in the same direction—which may be clockwise or counterclockwise as seen from behind the source. In some embodiments, and as shown in the figure, the coil shield may consist of a set of elongated conducting plates that positioned between coils and dielectric source wall, are aligned with long dimensions parallel to the axis of the coil, and each of which is electrically connected to at least one (e.g., one or more) other, and at least one (e.g., one or more) of which is connected to a point on the conductor 906. The gaps 907 between segments of the shield or slots in the single piece shield serve to permit the magnetic field to penetrate the conducting shield and heat the plasma while the shield at least partially blocks the electrostatic coupling between the coil and the plasma. As shown in the figure a lead to the first of said coils may be connected to the generator of rf or VHF (shown in circuit diagram in FIG. 10) while a lead to the second coil may be connected to a variable capacitor (shown in circuit diagram in FIG. 10) which may within its tuning range have capacitive reactance that cancels the inductive reactance of the second coil. In some embodiments, whether the coil shield is a single conductor or connected multiple conductors, there may be no conducting path in said shield that makes a full and complete circuit around the source such that continuous circumferential currents can flow in it. In this case there is an improved penetration of the magnetic field from the coil into the plasma because there is no conducting path for induced currents in the shield. Such induced currents would generate magnetic fields that oppose the change in the magnetic field from the excitation coil(s) and would thereby reduce the magnitude of the magnetic field from the coil that penetrates into the plasma. Said shield in some embodiments may also consist of a single piece conductor that has a complete closed conducting path around the source, and is slotted roughly parallel to the direction of the axis of said coils. In some embodiments said shield may extend axially beyond the coil in one or both directions and have slots roughly parallel to the axis that extend at least along a majority of the axial extent of the combined coils in the set. Such shield despite allowing induced currents counter to those in the coils, may still permit adequate power transmission into the plasma.

There may in some embodiments be one or more conducting walls of said source, such as that comprising the first side 903, that are connected to the reference potential for the rf/VHF generator or the housing of the ion source. In some embodiments there may also be a second conducting shield 908 (not shown in FIG. 9B) covering other areas of the dielectric walls of the source than those covered by the coil shield or being the actual vessel wall. Said second shield or wall may in some embodiments be connected to the reference potential for the rf/VHF generator or to the housing for the ion source (not shown). Such walls and/or second shield may provide an effective anode for rf/VHF currents that may be coupled into the plasma from the coil shield and thereby reduce the rf/VHF modulation of the plasma potential.

Figure 10A:
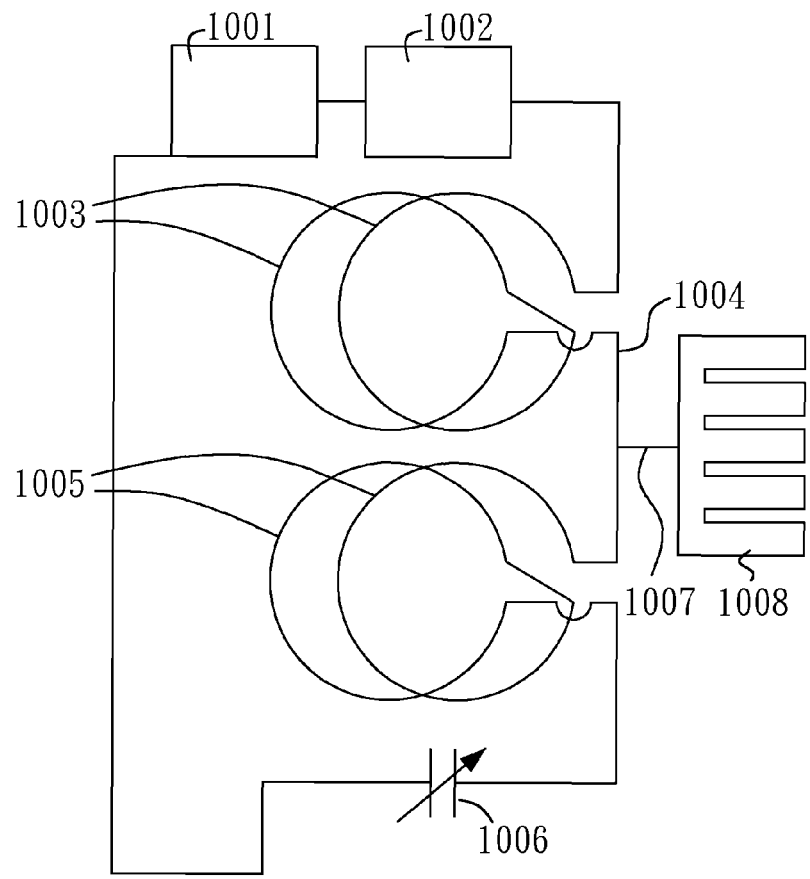
FIG. 10A illustrate another apparatus embodiment.

Embodiments of the invention including those shown in FIGS. 4, 5, 6A-6F and 9 may be operated in different modes at different phases of the ion source operation. FIG. 10A shows the electrical circuit of such an ion source, including the rf/VHF generator 1001, matching network 1002, first coil 1003, coil connector 1004, second coil 1005, and variable capacitor 1006. The rf/VHF current supplying power to the coils flows first from the generator through the match and then through the first coil 1003, and then through the second coil 1005 and thence through the variable capacitor 1006 to the reference potential for the ion source which is approximately the potential of the source housing (not shown) and for the housing for the rf generator 1001. Thus, the current returns after passing through the coil and the tuning variable capacitor to the housing for the generator, completing the circuit. There is also an electrical lead 1007 connecting the coil connector 1004 to the coil shield 1008. RF/VHF currents picked up by the coil shield 1008, predominantly from capacitive coupling from the coils 1003 and 1005, are also returned to the reference potential through the coil 1005 and the capacitor 1006. As the variable capacitor 1006 is tuned from a capacitance higher than resonance to a capacitance lower than the resonant value, it causes the net reactance between the coil connector and the reference potential to vary from inductive to capacitive.

Figure 10B:
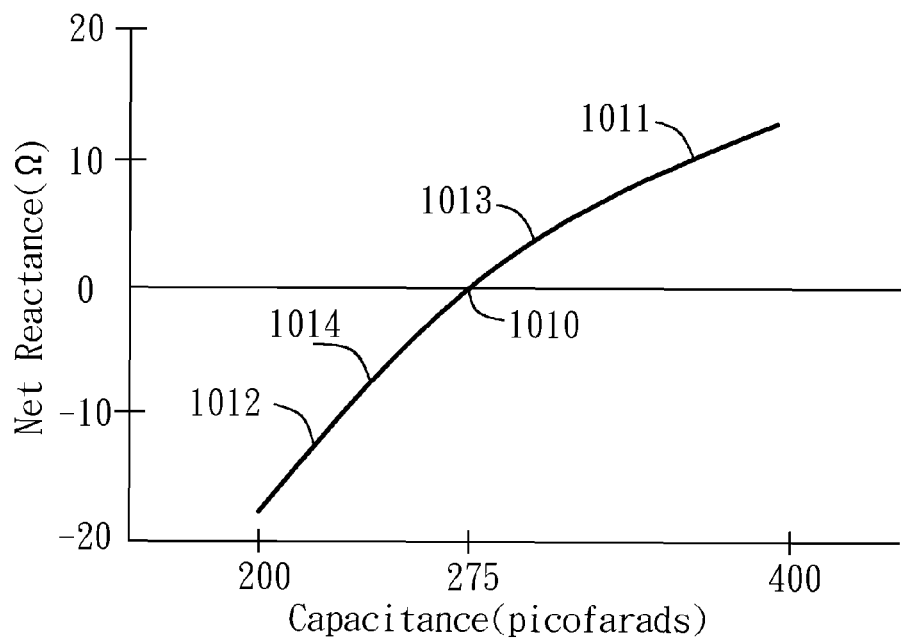
FIG. 10B illustrate an operation of the apparatus embodiment.

In FIG. 10B the total reactance which includes that of the second coil added to that of the variable capacitor and the connecting lines rf/VHF is plotted as a function of the capacitance of the variable capacitor for a nominal total inductance of the second coil and lines (connecting to the reference potential) of 0.5 micro-Henries for an rf frequency of 13.56 MHz. When the variable capacitor is tuned to the resonance value 1010 which is approximately 275 picofarads—where the capacitive reactance exactly cancels the inductive reactance of the coil plus the circuit connecting the coil to capacitor and then to reference potential—the voltage on the connector between coils becomes approximately zero. This is desirable for the phase of operation in which ion beams are being extracted and implanted because the rf/VHF voltage on the coil shield is approximately zero. The dc voltage is typically within a fraction of a Volt of the reference potential. When the source is to be started up and the plasma is to be ignited the capacitance may be tuned away from resonance to either higher 1011 or lower values 1012 of capacitance such that the connector and coil shield have substantial rf/VHF potential which may be of order 1000 Volts or more (typical coil currents being more than about 10 Amps during ignition) and thereby ignite the plasma via the capacitive coupling of coil shield to the volume within the source. Finally, when the source is to be cleaned and suitable reactive gases are flowed into the source the capacitor may be tuned to values corresponding to regions of curve shown as 1013 and 1014 which are at net reactance values above and below resonance. Said regions may provide more modest rf/VHF voltages on the coil shield than during ignition and provide ion bombardment of the interior walls of the source, both adjacent to the coil shield as well as walls connected to the reference potential or dielectric walls adjacent the second shield.

In some embodiments, not shown in a figure, said shield may be connected to a variable reactance element or a controllable source of rf/VHF at the same frequency as the power to the coil instead of being connected directly to the coil. Said reactive element may be a variable capacitor whose range is sufficient to provide a reactance to fully cancel the inductive reactance of the second coil.

In some exemplary embodiments of the ion source the gas and rf/VHF power conditions may be in the following ranges:
 1. Gas pressure total in the source may be from about 0.005 Pascals to 5 Pascals with a preferred range from about 0.025 Pascals to 1 Pascal.

2. Total gas flow into the source, including all gases and vapor sources may range from about 0.1 SCCM to about 20 SCCM, and preferably from about 0.5 SCCM to 5 SCCM.

3. RF/VHF power provided the source may range from about 10 Watts to about 5000 Watts, and preferably from about 100 Watts to about 3000 Watts.

The ion source disclosed may be used for implantation of a number of species. Particular species may include: Boron, Arsenic, Phosphorus, Carbon, Germanium, Antimony, Silicon, Fluorine, Oxygen, Helium, Hydrogen, Nitrogen, Aluminum, Tin, and molecular species including BF2+ as well as other species that may be used for ion implantation processes. The gas flow rate typically depends on the type of species to be implanted. For many atomic dopants using molecular gases as sources it may be advantageous to use feed gas flow rates at the low end of the cited ranges in order that the atomic fraction in the extracted beam be as high as possible. For instance, for producing a carbon beam a typical gas used is carbon dioxide. In producing an optimum beam gas flows from about 0.1 standard cc per minute (SCCM) to as much as 20 SCCM may be used with the flow more preferably in the range between about 0.5 SCCM and 5 SCCM. In the case of a Boron beam either BF3 or B2H6 may be used as feed gas with flows in the same range. In some embodiments arsenic beams may be made with either a gaseous source such as $AsH_3$ or with a vapor source which may include a separate controllably heated reservoir in which solid phase arsenic is contained. Similarly, phosphorus ions may be produced in a source using either phosphine gas or a solid phosphorus source from an evaporator oven. The rf/VHF ion source described in this disclosure is compatible with such vapor phase sources of the ionic species $As^+$ and $P^+$ because in some embodiments said ion source under most conditions runs with all its walls above 250° C. where vapor pressures of said elements are sufficient for the source to operate comfortably. In most cases the gases supplied for producing a given species of ion may be mixed with inert diluent gases such as He, Ar, or Xe and $N_2$. Use of such diluent gases may be done to permit the source to operate with a lower vapor pressure of the gas providing the ionic species. Feed gases that may be used as sources for various ionic species required for implantation processes are shown in TABLE I. In some embodiments the feed gas or a combination thereof, as listed in Table I, may be used for producing a species of ion in the source.

TABLE 1

| Implant Species | Feed Gas Type |
| --- | --- |
| Carbon+ | $CO_2$, CO, $CH_4$, $CF_4$, |
| Nitrogen+ | $N_2$, $NH_3$ |
| Fluorine+ | $F_2$, $CF_4$, $NF_3$ |
| Oxygen | $N_2O$, $O_2$, $H_2O$ |
| Boron | $BF_3$, $B_2H_6$ |
| Arsenic | $AsH_3$, As |
| Phosphorus | $PH_3$, P |
| Antimony | $SbH_3$ |
| Tin | $Sn(CH_3)_2$ |
| Aluminum | $Al(CH_3)_3$, $AlCl_3$ |
| Germanium | $GeH_4$ |
| Hydrogen | $H_2$, $NH_3$ |
| Argon | Ar |

In some embodiments a piece or structure of a solid, high purity element or compound mounted within the plasma vessel or at the wall of said vessel may be used instead of or in addition to said gaseous chemical source of the desired species. In some embodiments, when the ion source is producing a carbon beam, carbon dioxide may flowed into the source and additionally a piece, structure of high purity carbon or graphite may be positioned within the source or supported adjacent a wall of the source. Alternatively, an area or areas of the wall may have a thick coating or liner of carbon. In this case the free oxygen and oxygen ions in the gas within the source will etch the carbon piece, structure or liner and increase the amount of carbon in the gas phase. This may prove beneficial to the efficiency of the source in that a larger fraction of the ions extracted may be of carbon. In effect, the source gas may have sufficiently augmented carbon that it operates with a gas chemistry roughly equivalent to that when operating with the highly toxic gas, carbon monoxide, which would pose a hazard to the operating staff and may not be used by many manufacturers. In the case of other ionic species such as boron, phosphorus and arsenic, it may be advantageous to use gases such as diborane, phosphine or arsine as gaseous feedstock, supplemented with a small amount of the solid material placed in the source which will slowly etch as it provides additional species for the ion source. This same approach may also be used for dopants such as tin or germanium or antimony when used respectively with hydrides of said elements. The amount of said solid material that is etched and then enters the gas phase will depend on the current density and energy of ions bombarding that wall and its temperature. Such rate of introduction of material into the gas phase in the source is self-limiting since as the rate at which this material is etched increases it will increase the rate of deposition of said material on the interior walls of the source. In some embodiments of the disclosed ion source the rate of etching of said material within the source may be controlled by having said material mounted adjacent an interior wall of the source and positioning either a separate biasing electrode external to the dielectric wall of the source at that same location.

As a short summary, the invention proposes an ion source with a coil set or antenna, outside and proximate to the vessel. Hence, the generated ac inductive magnetic field may transmit energy into the vessel and then maintain the plasma ignited inside the vessel. Further, the proposed ion source may have the cover shield surrounding and/or covering a portion of the wall of the vessel, and serving as an anode so that the rf/VHF currents transmitted to the plasma are conducted away. Also, the proposed ion source may have a coil shield between the coil set and the vessel whose voltage is adjustable. Hence, by adjusting the rf/VHF voltage on the coil shield, it is optional to clean the ion source, ignite the plasma or maintain the plasma for ion implantation.

Although the present invention has been explained in relation to its preferred embodiments, it is to be understood that other modifications and variation can be made without departing the spirit and scope of the invention as hereafter claimed.

What is claimed is:

1. An ion source of an ion implanter, comprising:
    a vessel, a first side of said vessel having an extraction slit;
    a coil set having at least one induction coil for transmitting an ac power generated by a power generator into said vessel, said coil set being positioned outside said vessel and at least part of whose area is proximate to a second side of said vessel; and
    a coil shield that is positioned between said coil set and said vessel and is connected to said coil set.

2. The ion source as recited in claim 1, further being characterized by one or more of the following:

said coil shield being connected to at least one contact point in said coil set, wherein said contact point is positioned so that the parts of said coil set on either side of this connection point have approximately equal electrical inductance;

said coil shield being connected to an approximate midpoint of the electrical connection between said induction coil; and said coil shield being connected to an external rf/VHF voltage source that is variable and controllable so that an rf/VHF electrical potential can be imposed on the coil shield.

3. The ion source as recited in claim 1, said excitation coil having two or more sets of turns, wherein each set has at least one turn and said two or more sets of turns are positioned separately in a plane approximately parallel to said second side of said vessel.

4. The ion source as recited in claim 1, wherein there is a single coil that has two separate lobes and the configuration of said coil winding is to generate magnetic fields which have approximately opposing directions in the two lobes.

5. The ion source in claim 4, wherein the different lobes of said sets of windings are electrically connected in series by at least one current carrying line, wherein said current carrying line is parallel to said extraction slit.

6. The ion source as recited in claim 1, further comprising a cover shield covering the interior of said vessel, wherein said extraction slit is not covered and partial said second side proximate to said coil set is not covered.

7. The ion source as recited in claim 6, further being characterized by one or more of the following:

said cover shield being electrically coupled to a common potential of the source and a housing of said power generator;

said cover shield being electrically coupled to a power source providing a dc voltage; and said coil shield and said cover shield being shaped and positioned so that a line of sight from each said coil set into the interior of said vessel is substantially blocked by the combined shields.

8. The ion source as recited in claim 6, further being characterized by one or more of the following:

at least a portion of said cover shield being directly contacted with a portion of the wall of said vessel;

said coil shield being attached physically to said cover shield with an insulating fixture having a desired capacitance;

said cover shield having an opening being roughly the same shape as a said coil, for each said coil of said coil set;

said cover shield having larger open areas at the ends of an opening corresponding a said coil, for each said coil of said coil set; and said cover shield having one or more narrow splits which extend from the open area adjacent to said second side outward and then toward said first side.

9. The ion source as recited in claim 1, further being characterized by one or more of the following:

the distance between said coil set and said second side of said vessel being between one and ten centimeters;

said coil set being elongated along the direction of the large dimension of said extraction slit; and said coil set having a hourglass shape along the direction of the large dimension of said extraction slit.

10. The ion source as recited in claim 1, further being characterized by one or more of the following:

said ac power having a frequency range from 200 KHz up to 100 MHz;

said power generator providing said ac power in a specific frequency;

said power generator providing said ac power with adjustable frequency extending from an upper VHF band into a UHF band;

said power generator providing said ac power with adjustable frequency extending from an UHF band into a microwave band; and said second side being adjacent to said first side.

11. The ion source as recited in claim 1, further being characterized by one or more of the following:

said ac power having a specific frequency 13.56 MHz;

said second side at least in part being made of dielectric material; and said second side being opposite to said first side.

12. An ion source of an ion implanter, comprising:

a vessel, wherein a first side of said vessel has an extraction slit;

a coil set having two distinct sets of turns which are displaced one from the other in a direction parallel to a length direction of the extraction slit so they do not overlap with each other, and where both of said turns are positioned proximate to and outside a second side of said vessel; and a power generator configured to provide an ac power;

wherein said two sets of turns are connected in series electrically to said power generator.

13. The ion source as recited in claim 12, further being characterized by one or more of the following:

said two sets of turns being configured so that the produced magnetic fields are at any time in directions at least 90 degrees away from each other;

said turns being positioned so that they would mostly overlap the second side of the vessel when projected normal onto said second side;

said two sets of turns being wound in planes that are parallel or at an angle up to 90 degrees;

said two sets of turns are wound with the turns in planes that are parallel or at an angle that up to above 90 degrees; and said two sets of turns are connected in series and said second coil is wound in the opposite direction from said first coil.

14. The ion source as recited in claim 12, further comprising:

an electrical connector which connects a second end of a first coil of said coil set and a first end of a second coil of said coil set;

a coil shield which is positioned at least in part between said coil set and said vessel and is connected to an approximate midpoint of said electrical connector;

an impedance match network which electrically connects said power generator and a first end of said first coil of said coil set; and a tunable capacitor which has one terminal connected to a second end of said second coil and another terminal connected to a common potential of said power generator and a power supply housing.

15. The ion source as recited in claim 14, further being characterized by one or more of the following:

said tunable capacitor has a range of capacitance with a minimum value, such that the magnitude of the reactive impedance of said tunable capacitor is greater than the magnitude of the reactive impedance of said second coil at an operation frequency of said power generator; and said tunable capacitor has a range of capacitance with a maximum value being at least 20 percent more than said minimum value.

16. The ion source as recited in claim 14, wherein said electric connector is parallel to said extraction slit.

17. The ion source as recited in claim 12, further comprising:
an electrical connector which connects a second end of a first coil of said coil set and a first end of a second coil of said coil set;
an impedance match network which electrically connects said power generator and a first end of said first coil of said coil set;
a coil shield which is positioned at least in part between said coil set and said vessel and is electrically separated from said coil set; and
a tunable capacitor which has one terminal connected to said coil shield and another terminal connected to the reference potential;
wherein the reference potential also is connected to a second end of said second coil set and housing of said power generator.

18. The ion source as recited in claim 17, wherein said tunable capacitor with a range such that it is set at a value that causes a substantial ac voltage on said coil shield when the circuit is powered.

19. The ion source as recited in claim 17, further being characterized by one or more of the following:
said electric connector being parallel to said extraction slit; and
said tunable capacitor with a range such that it is set with capacitive reactance equal in magnitude and opposite in sign to the inductive reactance of the line.

20. The ion source as recited in claim 12, further comprising:
an electrical connector which connects a second end of a first coil of said coil set and a first end of a second coil of said coil set;
a first impedance match network which electrically connects said power generator and a first end of said first coil of said coil set;
a coil shield which is positioned at least in part between said coil set and said vessel and is electrically separated from said coil set;
a second impedance matching network which is electrically connected to said coil shield and is controllable; and
an external bias supply electrically connected to said second impedance matching network, said external bias supply being a controllable source of ac power;
wherein said external bias supply has a reference ground being electrically connected to a point having the reference potential;
wherein said power generator also has reference ground being electrically connected to said point having the reference potential.

21. The ion source as recited in claim 20, wherein both said external bias supply and said second impedance matching network are adjusted to provide an ac current having controllable phase and magnitude, at the same frequency of the ac current provided by said power generator, wherein the net voltage is the vector sum of the voltage induced by the capacitive coupling from said coil set and the applied voltage from said external bias supply.

22. The ion source as recited in claim 20, wherein said electric connector is parallel to said extraction slit.

23. The ion source as recited in claim 12, further comprising:
an electrical connector which connects a second end of a first coil of said coil set and a first end of a second coil of said coil set;
an impedance match network which electrically connects said power generator and a first end of said first coil of said coil set;
a coil shield which is positioned at least in part between said coil set and said vessel and is separated away said coil set;
an attenuator, wherein said attenuator and said impedance match network receive same output of said power generator;
a phase shifter/directional coupler, which electrically connects said attenuator and said coil shield;
a controller configured to control both said attenuator and said phase shifter;
wherein the local grounding point of said controller and the local ground of said power generator have the same potential.

24. The ion source as recited in claim 23, wherein said controller is adjusted to tune the voltage level of said coil shield appropriate for different operations inside said vessel.

25. The ion source as recited in claim 23, wherein said electric connector is parallel to said extraction slit.

26. The ion source as recited in claim 11, further comprising:
an impedance match network which electrically connects said power generator to both a first end of a first coil of said coil set and a first end of a second coil of said coil set;
a first reactive element which electrically connects a second end of said first coil to a local grounding point;
a second reactive element which electrically connects a second end of said second coil to said local grounding point;
a coil shield which is positioned at least in part between said coil set and said vessel and is separated away said coil set; and
a tunable capacitor, one end of said tunable capacitor is connected to said coil shield and another end of said tunable is connected to said local grounding point;
wherein said power generator is also grounded to said local grounding point.

27. The ion source as recited in claim 26, wherein said tunable capacitor is adjusted to tune the voltage level of said coil shield appropriate for different operations inside said vessel.

28. The ion source as recited in claim 12, further comprising:
an impedance match network which electrically connects said power generator;
a transformer, wherein a primary winding of said transform is connected at one end to said power generator and at the other end to a ground, wherein a secondary winding of said transformer is connected at one end to a first end of a first coil of said coil set and at the other end to a second end of a second coil of said coil set;
a coil shield which is positioned at least in part between said coil set and said vessel and is separated away said coil set;
an impedance matching network which is electrically connected to said coil shield and is controllable; and an external bias supply electrically connected to said impedance matching network, said external bias supply being a controllable source of ac power;

wherein said external bias supply has reference ground being electrically connected to a point having the reference potential;

wherein said power generator also has reference ground being electrically connected to said point having the reference potential.

29. The ion source as recited in claim 28, wherein both said external bias supply and said impedance matching network are adjusted to provide an ac current having controllable phase and magnitude, at the same frequency of the ac current provided by said power generator, wherein the net voltage is the vector sum of the voltage induced by the capacitive coupling from said coil set and the applied voltage from said external bias supply.

30. The ion source as recited in claim 28, further being characterized by one or more of the following:

the center-tap of said secondary winding of said transformer is directly connected to said coil shield;

the center-tap of said secondary winding of said transformer is connected through a capacitor to said reference ground; and the center-tap of said secondary winding of said transformer is connected through a capacitor to said coil shield.

31. The ion source as recited in claim 12, further comprising:

a source shield around at least a portion of said vessel, wherein said source shield has at least a first part and a second part which are not directly connected to each other electrically, wherein said second part is closer to said coil set than is said first part;

an electrical connector which connects a second end of a first coil of said coil set and a first end of a second coil of said coil set;

an impedance match network which electrically connects said power generator and a first end of said first coil of said coil set;

a reactive element which has one terminal connected to a second end of said second coil of said coil set and another terminal connected to the reference potential; and an electrical component which electrically connects at least one of said source shield parts to the reference potential;

wherein the reference potential also is connected to the housing of said power generator.

32. The ion source as recited in claim 31, further being characterized by one or more of the following:

said second part being electrically connected through said electrical component to the reference potential;

said second part being electrically connected to a reactive element, when said reactive element is a tunable capacitor its capacitive reactance can fully balance the inductive reactance of the circuit connecting it to the reference potential;

said second part being connected to said coil set at the middle point of said electrical connector;

said second part being connected to a point on said coil set that is positioned behind said vessel;

said first part consisting of one or more segments that are connected directly to the reference potential;

said first part of said source shield consisting of one or more segments that are connected through a low impedance to the reference potential;

a second part of said source shield, said third part being not electrically connected to either said first part or said second part, said third part being connected to a separately controllable ac source; and a third part of said source shield, said third part being not electrically connected to either said first part or said second part, said third part being connected to an adjustable reactive impedance.

33. The ion source as recited in claim 31, further being characterized by one or more of the following:

said electrical component being a separate power supply for ac from that used to power said coil set;

said electrical component being a variable reactive capacitor;

said electrical component being a tunable capacitor;

wherein said separate power supply is controllable so that the frequency of the power to that part of said source shield is the same as the powering said coil set;

wherein said power supply is controllable so that both the phase and the amplitude of the ac voltage of the part of said source shield is controllable.

34. The ion source as recited in claim 31, further being characterized by one or more of the following:

at least a portion of said source shield being the wall of said vessel that is in direct contact with the plasma inside said vessel;

there being openings and slots in one or more said parts through which said vessel may have lines of sight to said coil sets or other components around said vessel; and said second part having segments which block lines of sight from said coil set into said vessel.

35. The ion source as recited in claim 31, further being characterized by one or more of the following:

the combined parts of said source shield cover at least one-fourth of the surface of said vessel;

the ratio of the area of said second part to the combined area of said first part and said first side is between one-tenth to six-tenth; and the ratio of the area of said second part to the combined area of said first part and said first side is from two-tenth to eight-tenth.

36. The ion source as recited in claim 31, said electric connector is parallel to said extraction slit.

37. The ion source as recited in claim 12, further comprising a coil shield positioned between said coil set and said second side.

38. The ion source as recited in claim 37, wherein said coil shield is made of an electrically conducting material comprising metal or silicon, and said coil shield optionally contains insulating materials.

39. The ion source as recited in claim 37, wherein said coil shield is divided into a plurality of segments by a plurality of slots, and said segments are positioned around a centerpoint and both said segments and said slots are positioned alternatively, whereby the induction of large area eddy currents is prevented.

40. The ion source as recited in claim 37, said could shield being a combination of a plurality of segments, wherein said segments are electrically connected to each other but are not otherwise physically connected.

41. The ion source as recited in claim 37, said coil shield being a combination of a plurality of segments, said segments being positioned such at a majority of the area of one said segment at least partially blocks lines of sight from said coil set while a majority of the area of another said segment is not interposed between any parts of said coil set and said vessel.

42. The ion source as recited in claim 37, wherein said coil shield has a central electrically conducting support strut and a plurality of conducting segments supported by said central electrically conducting support strut, and said electrically conducting segments are separated by a plurality of gaps, whereby the induction of large area eddy currents is prevented.

43. The ion source as recited in claim 37, further comprising a cover shield surrounding at least a portion of said vessel, wherein said cover shield has an opening which is essentially overlapped with said coil shield along a direction vertical to said second side.

44. The ion source as recited in claim 43, wherein at least said extraction slit and partial said second side proximate to said coil set are not surrounded.

45. The ion source as recited in claim 43, wherein said cover shield has one or more narrow splits which extend from said opening outwardly.

46. The ion source as recited in claim 43, further being characterized by one or more the following:
said opening and said coil shield having approximately the same shape outlines, but essentially only said coil shield having slot patterns; and
said coil shield being slightly larger than said opening and being mounted so as to cover at least most of said opening.

47. The ion source as recited in claim 43, wherein said coil shield is physically supported by at least one insulating standoffs from said cover shield but electrically connected to the electrical connection between said two set of turns.

48. The ion source as recited in claim 12, further being characterized by one or more of the following:
each of said sets of turns having an elongated or hourglass shape;
said ac power being delivered count-clockwise through one said set of turns and delivered clockwise through another said set of turns;
said ac power being delivered count-clockwise through both said sets of turns;
said ac power being delivered clockwise through both said set of turns; and
said two sets of turns being wound in the opposite direction so that when current flows the magnetic field directions between said turns are between 90 degrees and 180 degrees apart.

49. The ion source as recited in claim 12, further being characterized by one or more of the following:
said ac power having a frequency range from 200 KHz up to 100 MHz;
said power generator providing said ac power in a specific frequency;
said power generator providing said ac power with adjustable frequency extending from an upper VHF band into a UHF band;
said power generator providing said ac power with adjustable frequency extending from an UHF band into a microwave band;
said second side being adjacent to said first side; and
said two sets of turns being wound so that magnetic fields of the two sets of turns are parallel or at an angle up to 90 degrees.

50. The ion source as recited in claim 12, further being characterized by one or more of the following:
said ac power having a specific frequency 13.56 MHz;
said second side being at least in part made of dielectric material;
said second side being opposite to said first side; and
said two sets of turns being wound so that their magnetic field are approximately opposite in direction and approximately equal in magnitude.

51. An ion source of an ion implanter, comprising:
a vessel, a first side of said vessel having an extraction slit;
a coil set, said coil set being wound circumferentially to cover a part of said vessel;
a coil shield being made of an electrically conducting material and being interposed between said coil set and a wall of said vessel; and
a power generator configured to provide an ac power to said coil set.

52. The ion source as recited in claim 51, further comprising said coil set being closest to a portion of the wall of said vessel that is dielectric.

53. The ion source as recited in claim 51, wherein said coil shield is electrically conducting and is chosen from a group consisting of the following: multiple electrically connected segments; a single electrical conducting piece with one or more slots; a set of elongated conducting plates positioned between said coil set and the wall of said vessel and aligned with long direction parallel to the axis of said coils of said coil set; and combination thereof.

54. The ion source as recited in claim 53, further being characterized by one or more of the following:
said coil shield being shaped to eliminate the conducting path in said coil shield that makes a full and complete circuit around said vessel, no matter whether said coil shield is single electrical conducting piece or multiple electrically connected segments;
said coil shield being a single electrical conducting piece that has a complete closed conducting path around said vessel; wherein said single electrical conducting piece is slotted roughly parallel to the direction of the axis of said coils; and
said coil shield extending axially beyond said coils in one or both directions and has slots roughly parallel to the axis extending at least along a majority of the axial extent of said coil set.

55. The ion source as recited in claim 53, further being characterized by one or more of the following:
said coil shield being connected electrically to a point on said coil set;
said coil shield being connected electrically to a conducting element that electrically connects said coil set;
each of said elongated conducting plates being electrically connected to at least one other; and
at least one of said elongated conducting plates being connected to a point on a conducting element which electrically connected to both said coil set and an electrically conducting coil shield interposed between said coil set and the wall of said vessel.

56. The ion source as recited in claim 51, wherein said coil set has at least two approximately round coils being connected in series and being wound around said vessel in the same direction.

57. The ion source as recited in claim 56, wherein one end of said coil set is connected to said power generator and another end of said coil set is connected to a variable capacitor which may within its tuning range that cancels the inductive reactance of a said coil having said another end.

58. The ion source as recited in claim 51, further being characterized by one or more of the following:

a partial wall of said vessel is a conducting wall and electrically connected to the reference potential of said power generator or the housing of said vessel;

a second conducting shield covers other areas of the wall of said vessel than those covered by said coil shield, said second conducting shield is electrically connected to the reference potential of said power generator or the housing of said vessel; and a second conducting shield is embedded into the wall of said vessel and behaves as an actual vessel wall, said second conducting shield is electrically connected to the reference potential of said power generator or the housing of said vessel.

59. An ion source of an ion implanter, comprising:
a first coil which has at least one turn;
a second coil which has at least one turn;
a coil connector which electrically connects said first coil and said second coil in series;
an ac power generator which provides an ac power;
a matching network which electrically connects said ac power generator and said first coil in series;
a variable capacitor which electrically connects to said coil; and
a coil shield which is positioned between said coils and a vessel;
wherein said coil connector and said second coil are separately connected to opposite terminals of said second coil;
wherein a reference potential of said ac power generator is equal to that of said variable capacitor.

60. The ion source as recited in claim 59, the variable capacitance range of said variable capacitor allows the net reactance between said coil connector and the reference potential being varied from inductive to capacitance.

61. The ion source as recited in claim 59, further being characterized by one or more of the following:
said coil shield is electrically connected to said coil connector;
said coil shield is electrically connected to a variable reactance element at the same frequency as said ac power to said coils;
said coil shield is electrically connected to a variable reactance element at the same frequency as said ac power to said coils, wherein said reactive element is a variable capacitor whose range is sufficient to provide a reactance to fully cancel the inductive reactance of said second coil; and
said coil shield is electrically connected to a controllable ac source at the same frequency as the ac power to said coils.

62. An ion source of an ion implanter, comprising:
a vessel, a first side of said vessel having an extraction slit;
a power generator which provides an ac power;
a cover shield covering at least a part of said vessel; and
a coil set being positioned outside said vessel and at least part of whose area is proximate to a second side of said vessel, wherein said coil set is configured to transmit said ac power to said vessel.

63. The ion source as recited in claim 62 wherein at least said extraction slit and a continuous area of a second side that is proximate to said coil set are not covered by said cover shield.

64. The ion source as recited in claim 62, further being characterized by one or more of the following:
at least a portion of said cover shield being directly contacted with a portion of the wall of said vessel;
said cover shield having an opening being roughly the same shape as that of said coil set; and
said cover shield having larger open areas at the ends of an opening corresponding to said coil set.

65. The ion source as recited in claim 62, wherein said cover shield is electrically connected to at least one of the following: the common potential of said power generator and a housing of said vessel, and the output of a high dc voltage power supply.

66. The ion source as recited in claim 62, further being characterized by one or more of the following:
said coil set having at least one induction coil for transmitting said ac power to said vessel;
said coil set consisting of two sets of turns being connected in series and spaced from each other approximately parallel to the long direction of said extraction slot and have opposite winding directions;
said coil set having two separate sets of windings being not overlapped, with the line of centers from the area of one said set of windings to the other said set approximately parallel to said extraction slit;
said coil set having two separate sets of windings having a shape and configuration that is symmetrical about a plane that intersects said extraction slit at its midpoint in the longer direction; and
said coil set having two separate sets of turns, wherein the upper and lower set of windings of said coil set are not symmetrical in shape or configuration but approximately are symmetric in said ac power injection into a plasma within said vessel.

67. The ion source as recited in claim 62, further being characterized by one or more of the following:
said ac power having a frequency range from 200 KHz up to 100 MHz;
said power generator providing said ac power in a specific frequency;
said power generator providing said ac power with adjustable frequency extending from an upper VHF band into a UHF band;
said power generator providing said ac power with adjustable frequency extending from an UHF band into a microwave band; and
said second side adjacent to said first side.

68. The ion source as recited in claim 62, further being characterized by one or more of the following:
said ac power having a specific frequency 13.56 MHz;
said second side at least in part made of a dielectric material; and
said second side opposite to said first side.

* * * * *